United States Patent
Hammond

(10) Patent No.: US 8,570,122 B1
(45) Date of Patent: Oct. 29, 2013

(54) THERMALLY COMPENSATING DIELETRIC ANCHORS FOR MICROSTRUCTURE DEVICES

(75) Inventor: Jonathan Hale Hammond, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 60 days.

(21) Appl. No.: 12/779,307

(22) Filed: May 13, 2010

Related U.S. Application Data

(60) Provisional application No. 61/177,886, filed on May 13, 2009.

(51) Int. Cl.
*H01H 51/22* (2006.01)

(52) U.S. Cl.
USPC ............................ 335/78; 200/181

(58) Field of Classification Search
USPC ............................ 335/78; 200/181
See application file for complete search history.

(56) References Cited

U.S. PATENT DOCUMENTS

| | | | |
|---|---|---|---|
| 5,658,698 A * | 8/1997 | Yagi et al. | 430/11 |
| 6,127,908 A * | 10/2000 | Bozler et al. | 333/246 |
| 6,153,839 A | 11/2000 | Zavracky et al. | |
| 6,469,602 B2 * | 10/2002 | Ruan et al. | 335/78 |
| 6,625,004 B1 | 9/2003 | Musolf et al. | |
| 6,639,494 B1 | 10/2003 | Bluzer | |
| 6,777,765 B2 | 8/2004 | Chen et al. | |
| 6,835,589 B2 * | 12/2004 | Pogge et al. | 438/52 |
| 7,135,766 B1 | 11/2006 | Costa et al. | |
| 7,605,675 B2 | 10/2009 | Bar et al. | |
| 7,956,709 B2 | 6/2011 | Watanabe et al. | |
| 7,999,635 B1 * | 8/2011 | Quevy et al. | 333/186 |
| 7,999,643 B1 | 8/2011 | Dening et al. | |
| 8,018,308 B2 | 9/2011 | Kwon et al. | |
| 8,159,056 B1 | 4/2012 | Kim et al. | |
| 2003/0058069 A1 * | 3/2003 | Schwartz et al. | 335/78 |
| 2005/0048687 A1 | 3/2005 | Tatic-Lucic | |
| 2005/0183938 A1 | 8/2005 | Chou | |
| 2006/0012014 A1 | 1/2006 | Chen et al. | |
| 2006/0108675 A1 | 5/2006 | Colgan et al. | |
| 2006/0181379 A1 | 8/2006 | Schwartz et al. | |
| 2006/0254345 A1 | 11/2006 | King et al. | |

(Continued)

OTHER PUBLICATIONS

Costa, J. et al, "Integrated MEMS Switch Technology on SOI-CMOS," Proceedings of Hilton Head Workshop 2008: A Solid-State Sensors, Actuators and Microsystems Workshop, Jun. 2008, 4 pages.

(Continued)

*Primary Examiner* — Bernard Rojas
(74) *Attorney, Agent, or Firm* — Withrow & Terranova, P.L.L.C.

(57) ABSTRACT

A microstructure device that includes at least one thermally compensating anchor for preventing undesirable thermal displacement or actuation during manufacturing or operation is disclosed. In particular, the microstructure device includes a substrate and a movable structure suspended above the substrate by at least one anchor. The anchor is attached to the substrate. The anchor also includes an upper area of an upper surface region of a bottom portion attached to a lower surface of a proximal portion of the movable structure. The anchor further includes a top portion having a lower area of a lower surface region attached to an upper surface of the proximal portion of the movable structure, wherein the lower surface region of the top portion and the upper surface region of the bottom portion are geometrically asymmetric.

27 Claims, 17 Drawing Sheets

(56) References Cited

U.S. PATENT DOCUMENTS

| | | | |
|---|---|---|---|
| 2007/0103028 | A1 | 5/2007 | Lewis et al. |
| 2007/0172975 | A1 | 7/2007 | Tomomatsu et al. |
| 2007/0202626 | A1 | 8/2007 | Liu |
| 2007/0281381 | A1 | 12/2007 | Ayazi |
| 2007/0290773 | A1 | 12/2007 | Bar et al. |
| 2008/0164542 | A1 | 7/2008 | Yang et al. |
| 2009/0321857 | A1 | 12/2009 | Foster et al. |
| 2010/0038730 | A1* | 2/2010 | Sandhu et al. ............... 257/415 |
| 2010/0127172 | A1* | 5/2010 | Nikoobakht ................. 250/332 |

OTHER PUBLICATIONS

Costa, J. et al, "A Silicon RFCMOS SOI Technology for Integrated Cellular/WLAN RF TX Modules," Proceedings of the IEEE MTS Microwave Symposium, Jun. 2007, pp. 445-448, IEEE.

Guan, Lingpeng et al., "A Fully Integrated SOI RF MEMS Technology for System-on-a-Chip Applications," IEEE Transactions on Electron Devices, Jan. 2006, pp. 167-172, vol. 53, No. 1, IEEE.

Joseph, Alvin et al., "A 0.35 um SiGe BiCMOS Technology for Power Amplifier Applications," IEEE BCTM Conference Proceedings, Sep. 30-Oct. 2, 2007, pp. 198-201, IEEE.

Kelly, Dylan et al., "The State-of-the-Art of Silicon-on-Sapphire CMOS RF Switches," Proceedings of the IEEE Compound Semiconductor Symposium, Oct. 30-Nov. 2, 2005, pp. 200-205.

Mazure, Carlos et al., "Engineering Wafers for the Nanotechnology Era," Proceedings of ESSCIRC, Sep. 2005, pp. 29-38, IEEE.

Shokrani, Mohsen et al., "InGap-Plus(TM): A Low Cost Manufacturable GaAs BiFET Process Technology," Proceedings of the GaAs MANTECH Conference, Nov. 2006, pp. 153-156.

Tinella, C. et al., "0.13um CMOS SOI SP6T Antenna Switch for Multi-Standard Handsets," Topic Meeting on Silicon Monolithic Circuits in RF Systems, Jan. 2006, pp. 58-61, IEEE.

Tombak, Ali et al, "A Flip-Chip Silicon IPMOS Power Amplifier and a DC/DC Converter for GSM 850/900/1800/1900 MHz Systems," Proceedings of the IEEE Radio Frequency Integrated Circuits Symposium, Jun. 2007, pp. 79-82, IEEE.

Wohlmuth, Walter A. et al., "E-/D-pHEMT Technology for Wireless Components," Proceedings of the Compound Semiconductor Circuit Symposium, Oct. 2004, pp. 115-118, IEEE.

De Silva, A.P. et al, "Motorola MEMS switch technology for high frequency applications," 2001 Microelectromechanical Systems Conference, Aug. 2001, pp. 22-24, IEEE.

Reines, I. et al., "Performance of Temperature-Stable RF MEMS Switched Capacitors under High RF Power Conditions," 2010 IEEE MTT-S International Microwave Symposium Digest (MTT), May 23-28, 2010, pp. 292-295, IEEE.

Notice of Allowance for U.S. Appl. No. 11/955,918 mailed Apr. 2, 2010, 9 pages.

Final Office Action for U.S. Appl. No. 11/955,918 mailed Jan. 8, 2010, 11 pages.

Non-final Office Action for U.S. Appl. No. 11/955,918 mailed Jun. 25, 2009, 14 pages.

Non-final Office Action for U.S. Appl. No. 12/709,979 mailed Feb. 17, 2012, 12 pages.

Non-final Office Action for U.S. Appl. No. 12/710,108 mailed Sep. 1, 2011, 7 pages.

Notice of Allowance for U.S. Appl. No. 12/710,108 mailed Jan. 9, 2012, 8 pages.

Notice of Allowance for U.S. Appl. No. 12/710,108 mailed Jul. 13, 2012, 8 pages.

Notice of Allowance for U.S. Appl. No. 12/709,979 mailed Sep. 10, 2012, 9 pages.

Non-final Office Action for U.S. Appl. No. 12/710,195 mailed Dec. 28, 2012, 9 pages.

Notice of Allowance for U.S. Appl. No. 13/707,084 mailed Apr. 11, 2013, 9 pages.

Non-Final Office Action for U.S. Appl. No. 12/710,195, mailed Jun. 19, 2013, 10 pages.

Notice of Allowance for U.S. Appl. No. 13/707,084, mailed Jun. 21, 2013, 9 pages.

* cited by examiner

THERMALLY COMPENSATING DIELETRIC ANCHORS FOR MICROSTRUCTURE DEVICES

RELATED APPLICATIONS

This application claims the benefit of provisional patent application Ser. No. 61/177,886, filed May 13, 2009, which is hereby incorporated herein by reference in its entirety. This application also relates to U.S. patent application Ser. No. 12/710,195, entitled "Thermally Neutral Anchor Configuration for an Electromechanical Actuator," and to U.S. patent application Ser. No. 12/710,108, entitled "Thermally Tolerant Electromechanical Actuators," now U.S. Pat. No. 8,314,467, and also to U.S. patent application Ser. No. 12/709,979, entitled "Thermally Tolerant Anchor Configuration for a Circular Cantilever," now U.S. Pat. No. 8,354,901, all three of which were concurrently filed on Feb. 22, 2010, the disclosures of which are hereby incorporated herein by reference in their entireties. This application further relates to U.S. patent application Ser. No. 11/955,918 entitled "Integrated MEMS Switch," filed on Dec. 13, 2007, now U.S. Pat. No. 7,745,892, the disclosure of which is hereby incorporated by reference in its entirety.

FIELD OF THE DISCLOSURE

The present disclosure relates to radio frequency (RF) micro-electro-mechanical systems (MEMS) switches, and in particular to the stable volume manufacture of RF MEMS switches.

BACKGROUND

As technology evolves, there is an increased need for microstructure devices that are provided on substrates, which include but are not limited to semiconductor substrates having semiconductor components, to form various types of circuits. Microstructure devices include but are not limited to micro-electro-mechanical system (MEMS) devices such as MEMS accelerometers and MEMS pressure sensors. Moreover, microstructure devices make up mechanical actuators such as those found in MEMS-based ink jet printer nozzles, etc. Another class of microstructure devices includes Micro-Opto-electromechanical systems (MOEMS) devices that are usable for sensing or manipulating optical signals. MOEMS devices are usable as optical switches, optical cross-connects, and optical interferometers. Other microstructure devices include miniature switches that often act as relays, and are generally referred to as MEMS switches.

All of the microstructures mentioned above share many of the problems encountered during manufacturing and operation of microstructure devices. An example of one such problem is discussed below in terms of MEMS switch manufacture and operation.

MEMS switches generally include a movable structure such as a cantilever, which has a first end anchored to the semiconductor substrate and a second free end having a cantilever contact. When the MEMS switch is activated, the cantilever moves the cantilever contact against a substrate contact located on the semiconductor substrate and under the cantilever contact.

Turning to FIGS. 1A and 1B, a semiconductor device 10 having a MEMS switch 12 is illustrated. The MEMS switch 12 is effectively formed on a semiconductor substrate 14. The MEMS switch 12 includes a cantilever 16, which is formed from a conductive material, such as gold. The cantilever 16 has a first end and a second end. The first end is coupled to the semiconductor substrate 14 by an anchor 18. The first end of the cantilever 16 may also be electrically coupled to a first conductive pad 20 at or near the point where the cantilever 16 is anchored to the semiconductor substrate 14. Notably, the first conductive pad 20 may play a role in anchoring the first end of the cantilever 16 to the semiconductor substrate 14 as depicted.

The second end of the cantilever 16 forms or is provided with a cantilever contact 22, which is suspended over a contact portion 24 of a second conductive pad 26. Thus, when the MEMS switch 12 is actuated, the cantilever 16 moves the cantilever contact 22 into electrical contact with the contact portion 24 of the second conductive pad 26 to electrically connect the first conductive pad 20 to the second conductive pad 26.

To actuate the MEMS switch 12, and in particular to cause the second end of the cantilever 16 to move the cantilever contact 22 into contact with the contact portion 24 of the second conductive pad 26, an actuator plate 28 is disposed over a portion of the semiconductor substrate 14 and under the middle portion of the cantilever 16. To actuate the MEMS switch 12, a potential difference is applied between the cantilever 16 and the actuator plate 28. The presence of this potential difference creates an electrostatic force that effectively moves the second end of the cantilever 16 toward the actuator plate 28, thus changing the position of the cantilever 16 from the position illustrated in FIG. 1A to the position illustrated in FIG. 1B.

Typically, the first conductive pad 20, the second conductive pad 26, and the actuator plate 28 are formed from a single metallic or conductive layer, such as gold, copper, platinum, or the like. The particular form factor for the first conductive pad 20, the second conductive pad 26, and the actuator plate 28 is provided through an etching or other patterning technique. With continued reference to FIGS. 1A and 1B, the MEMS switch 12 may be encapsulated by one or more encapsulating layers 30 and 32, which make up a wafer level package (WLP) around the MEMS switch 12. Moreover, the encapsulating layers 30 and 32 form a substantially hermetically sealed cavity about the cantilever 16. The cavity is generally filled with an inert gas. Once the encapsulating layers 30 and 32 are in place and any other semiconductor components are formed on the semiconductor substrate 14, a plastic overmold 34 may be provided over the encapsulating layers 30 and 32 and any other semiconductor components.

With continued reference to FIGS. 1A and 1B, the substrate 14 is preferably formed using a semiconductor-on-insulator process, such as a silicon-on-oxide insulator process. In particular, the substrate 14 includes a handle wafer 36 that is formed from silicon, sapphire, glass, or like material to form a foundation layer for the semiconductor device 10. The handle wafer 36 is typically a few hundred microns thick. An insulator layer 38 is formed over the handle wafer 36. The insulator layer 38 is generally formed from an oxide, such as Silicon Dioxide ($SiO_2$), which may range in thickness from 0.1 to 2 microns in the preferred embodiment. A device layer 40, which may include one or more layers, is formed using an appropriate semiconductor material.

The device layer 40 is the layer or layers in which active semiconductor devices, such as transistors and diodes that employ PN junctions, are formed. The device layer 40 is initially formed as a base semiconductor layer that is subsequently doped with N-type and P-type materials to form the active semiconductor devices. Thus, the active semiconductor devices, except for any necessary contacts or connections traces, are generally contained within the device layer 40.

Those skilled in the art will recognize various techniques for forming active semiconductor devices in the device layer 40. A metal-dielectric stack 42 is formed over the device layer 40, wherein a plurality of metal and dielectric layers are alternated to facilitate connection with and between the active devices formed in the device layer 40. Further, in the preferred embodiment the handle wafer 36 is made of a high-resistivity semiconductor material where resistance is greater than 500 ohm-cm.

With the present disclosure, active semiconductor devices may be formed in the device layer 40 and connected to one another via the metal-dielectric stack 42 directly underneath the MEMS switch 12. Since the device layer 40 resides over the insulator layer 38, high voltage devices, which may exceed ten (10) volts in operation, may be formed directly under the MEMS switch 12 and connected in a way to control operation of the MEMS switch 12 or associated circuitry. Although silicon is described in the preferred embodiment, the semiconductor material for the device layer 40 may include Gallium Arsenide (GaAs), Gallium Nitride (GaN), Indium Phosphide (InP), Silicon Germanium (SiGe), and like semiconductor materials. The device layer 40 typically ranges in thickness from 0.1 microns to 20 or more microns.

As illustrated in FIGS. 1A and 1B, a passivation layer 44 may be provided over the metal-dielectric stack 42. As may be best seen from the perspective view of FIG. 2, a metal layer used to form the first conductive pad 20, the second conductive pad 26, and the actuator plate 28 may be formed over the passivation layer 44 and etched to form the respective ones of the first conductive pad 20, the second conductive pad 26, and the actuator plate 28. Prior to packaging, the cantilever 16 is "released" and is free to actuate or deform. In particular, the cantilever 16 may be released following formation of a small micro-cavity surrounding the MEMS switch 12. A sacrificial material such as polymethylglutarimide (PMGI) is etched away using wet etches. Following drying and cleaning of the MEMS switch 12, a dielectric is used to hermetically seal the micro-cavity. The deposition temperature for the dielectric is typically 250° C. Later in the manufacturing process, the device can experience multiple exposures to 260° C. solder reflow during attachment of a module incorporating the MEMS switch 12 to an end-user laminate.

A problem of undesirable deformation of the MEMS switch 12 often occurs due to a significant difference in the coefficient of thermal expansion (CTE) between the metal comprising the MEMS switch 12 and the semiconductor or insulator comprising the passivation layer 44. The CTE of the metal making up the MEMS switch 12 often ranges from two to seven times larger than the CTE of the semiconductor or insulator making up the passivation layer 44. At room temperature (i.e., 25° C.), the difference in the CTE does not present a problem. However, during manufacture, assembly, or operation of the MEMS switch 12, the temperature of the MEMS switch 12 and the substrate 14 (FIGS. 1A and 1B), including the passivation layer 44, can range from 85° C. to 400° C. In such circumstances, particularly in the case of an ohmic contact switch function for the MEMS switch 12, it is desirable to ensure that the cantilever contact 22 and the second conductive pad 26 or the passivation layer 44 do not make contact. In other applications, such as MEMS accelerometers and the like, any deformation due to thermal stresses is detrimental.

FIG. 3 illustrates how differences in CTE may lead to a thermally induced deformation of the cantilever 16. A plurality of dots shown in a cross-section of the cantilever 16 and the anchor 18 represent individual metal domains making up the cantilever 16 and the anchor 18. As the MEMS switch 12 is heated during manufacturing and/or assembly, the metal domains expand and push against each other. The domains further from the passivation layer 44 are allowed to expand more than the domains that are closer to the passivation layer 44, thereby producing a deflection force on the cantilever 16. The deflection force is represented by an arrow at the free end of the cantilever 16. In this case, the deflection force urges the cantilever towards the passivation layer 44.

FIG. 4 depicts the results of a finite element simulation of the mechanical effects experienced by the MEMS switch 12 when the MEMS switch 12 is heated to a steady state temperature of 300° C. The finite element simulation shows that when the MEMS switch 12 reaches a temperature of 300° C., the cantilever 16 will have rotated enough that the cantilever contact 22 will be in contact with the second conductive pad 26. The MEMS switch 12 has a switch open state that typically maintains a one-half micrometer gap between the cantilever contact 22 and the second conductive pad 26. Further finite element simulations show that the deflection of the cantilever 16 may allow the cantilever contact 22 to traverse gap distances that exceed one-half micrometer.

Notice that a rotational axis 46 of the cantilever 16 is perpendicular to a longitudinal axis 48 of the cantilever 16. As suggested by the finite element simulations, due to the combination of the significant difference in CTE between the metal of the MEMS switch 12 and the semiconductor or insulator comprising the passivation layer 44 and the elevated temperatures experienced by the MEMS switch 12 during manufacturing, assembly, or operation, the cantilever 16 may be thermally deflected to rotate about the rotational axis 46. As the temperature of the MEMS switch 12 increases, the rotation of cantilever 16 may become so pronounced that the cantilever contact 22 will contact the second conductive pad 26. An adhesion between the cantilever contact 22 and the second conductive pad 26 may prevent the cantilever contact 22 and the second conductive pad 26 from breaking contact as the temperature of the MEMS switch 12 decreases. A failure to break contact between the cantilever contact 22 and the second conductive pad 26 will result in a failed MEMS switch along with a failed product incorporating the MEMS switch 12. Furthermore, temperature swings present in an end application for the MEMS switch 12 will lead to thermal deflections of the cantilever 16, which may alter critical operating parameters such as the ability to open and close or the long term reliability of the MEMS switch 12.

Turning now to FIG. 5A, a typical microstructure device 50 having a configuration that can be applied to other products beyond MEMS switches is depicted. The microstructure device 50 includes a movable structure 52 that is suspended above a substrate 54 by means of an anchor 56. While the movable structure 52 may be a conductive cantilever beam as typically used in a MEMS switch like the MEMS switch 12 discussed above, the anchor 56 is usually formed of a dielectric material such as silicon nitride, silicon oxide, or silicon oxynitride.

FIG. 5B depicts an exploded view of the microstructure device 50. The movable structure 52 has an upper surface 58, a lower surface 60, a proximal portion 62, and a distal portion 64. The anchor 56 includes a bottom portion 66 having a lower area of a lower surface region 68 attached to the substrate 54 at a substrate surface area outlined by a dashed box 70. An upper area of an upper surface region 72 of the bottom portion 66 is attached to the lower surface 60 of the proximal portion 62 of the movable structure 52. A top portion 74 of the anchor 56 has a lower area of a lower surface region 76 attached to the upper surface 58 of the proximal portion 62 of the movable structure 52. A dashed line 78 represents a boundary between the proximal portion 62 of the movable structure 52 that is constrained by the anchor 56, and a free portion of the movable structure 52.

With the microstructure device 50, the upper area of the upper surface region 72 of the bottom portion 66 of the anchor 56 that is attached to the lower surface 60 of the proximal portion 62 of the movable microstructure 52 is geometrically symmetric with the lower area of the lower surface region 76 attached to the upper surface 58 of the proximal portion 62. In particular, the upper area of the upper surface region 72 attached to bottom surface 60, and the lower area of the lower surface region 76 attached to the upper surface 58 are equal in area. Furthermore, the lower area of the lower surface region 76 attached to the upper surface 58 directly overshadows the upper area of the upper surface region 72 attached to lower surface 60.

FIG. 5C depicts the results of a finite element simulation of the mechanical effects experienced by the microstructure device 50 when the microstructure device 50 is heated during manufacturing or operation. During the finite element simulation, an unconstrained length of the movable structure 52 was set at around 125 micrometers (μm), whereas a constrained length of the movable structure 52 was set at around 30 μm. The results of the finite element simulation show that a tip 80 of the movable structure 52 will droop around 0.6 μm towards the substrate 54 when heated to a steady state temperature of 400° C. As a result of the significant droop, the microstructure device 50 may become permanently damaged or unusable for certain applications.

Significant yield loss, which may approach upwards of 50%, may be attributed to this thermally induced actuation during manufacture of microstructure devices with the kinds of attachment configurations described above. Also, significant performance degradation may be attributed to thermally induced actuation or deformation during temperature excursions in an end product application that incorporates microstructure devices. Thus, the need for microstructure attachment configurations that can prevent this kind of thermal displacement or actuation is apparent.

SUMMARY OF THE DISCLOSURE

Those skilled in the art will appreciate the scope of the present disclosure and realize additional aspects thereof after reading the following detailed description in association with the accompanying drawings.

The present disclosure provides a microstructure device that includes at least one thermally compensating anchor for preventing undesirable thermal displacement or actuation during manufacturing or operation. In particular, the microstructure device of the present disclosure includes a substrate, and a movable structure having an upper surface, a lower surface, a proximal portion and a distal portion suspended above the substrate by at least one anchor attached to the substrate. The anchor has a bottom portion having a lower area of a lower surface region that is attached to the substrate. The anchor also includes an upper area of an upper surface region attached to the lower surface of the proximal portion of the movable structure. The anchor further includes a top portion having a lower area of a lower surface region attached to the upper surface of the proximal portion of the movable structure, wherein the lower surface region of the top portion and the upper surface region of the bottom portion are geometrically asymmetric. This geometric asymmetry can be configured during fabrication of the microstructure device such that thermal displacement of the movable structure is controlled to within a desirable range over a larger temperature range experienced by the microstructure during manufacturing or operation.

BRIEF DESCRIPTION OF THE DRAWING FIGURES

The accompanying drawing figures incorporated in and forming a part of this specification illustrate several aspects of the invention and together with the description serve to explain the principles of the invention. In the drawings, like reference numbers indicate identical or functionally similar elements. The drawings are not to scale.

Figure 1A:
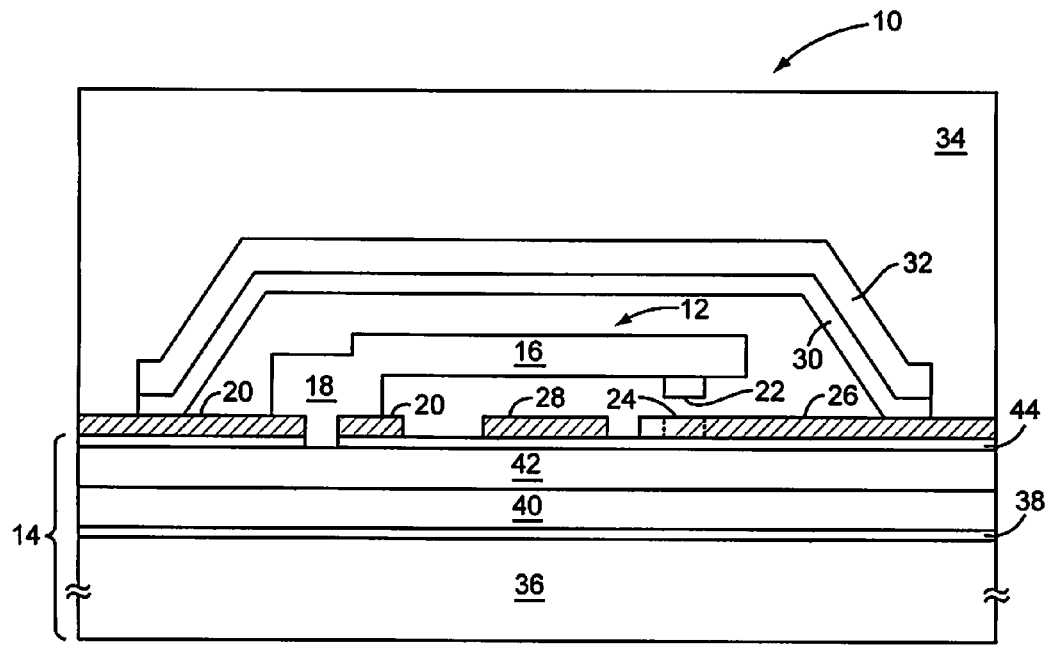
FIGS. 1A and 1B illustrate an exemplary micro-electromechanical systems (MEMS) switch in open and closed positions, respectively.
Figure 1B:
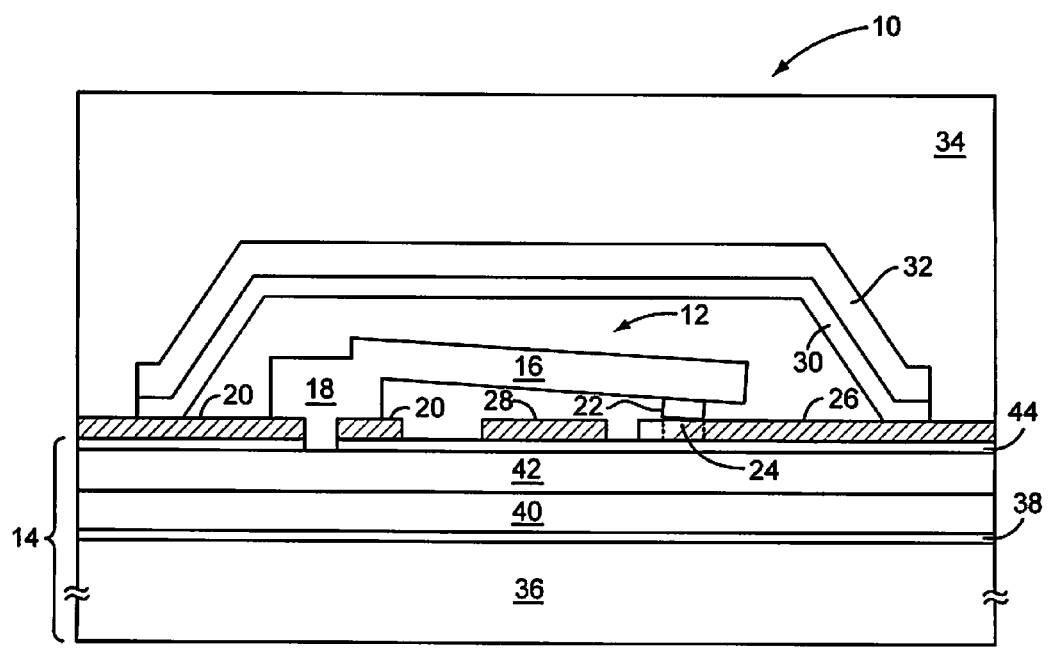
Figure 2:
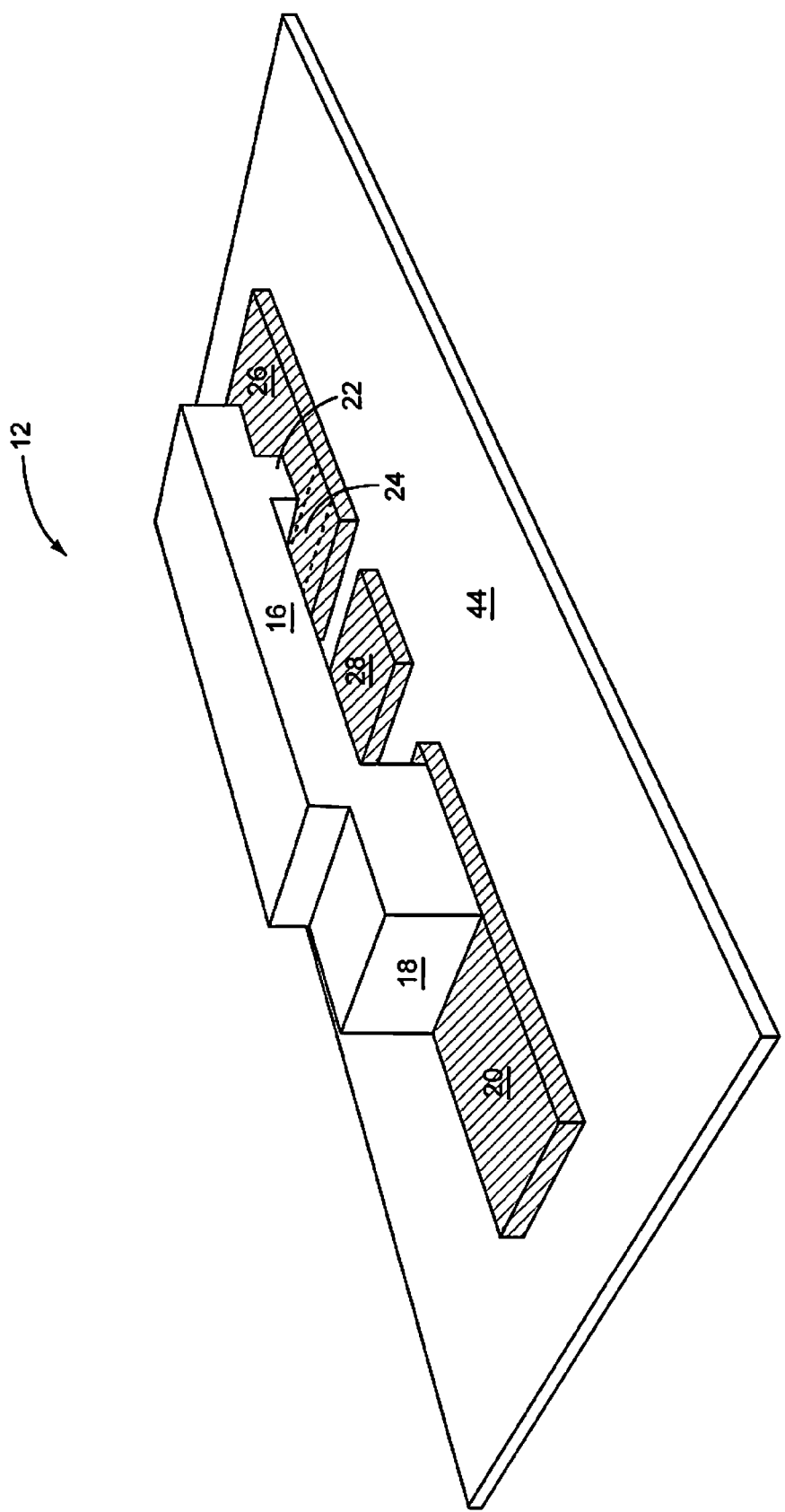
FIG. 2 is a perspective view of a portion of the MEMS switch of FIGS. 1A and 1B.
Figure 3:
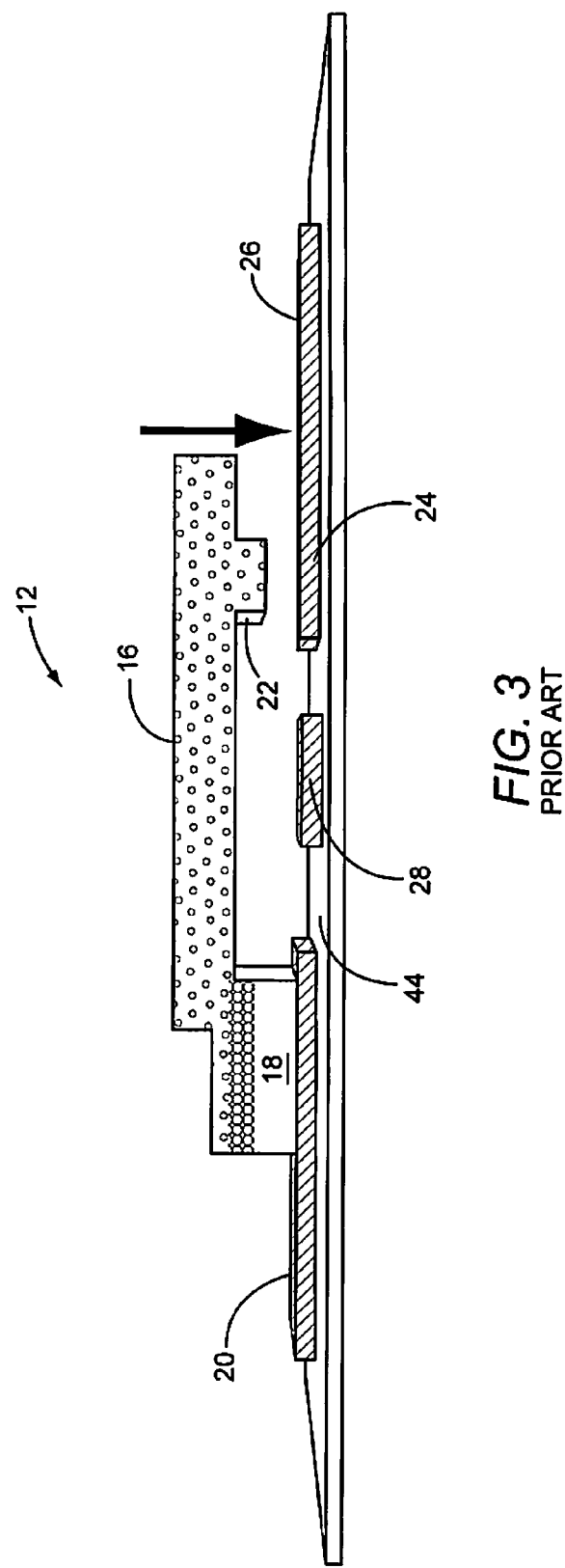
FIG. 3 illustrates the origin of the thermally induced mechanical stress in the MEMS switch during manufacturing.
Figure 4:
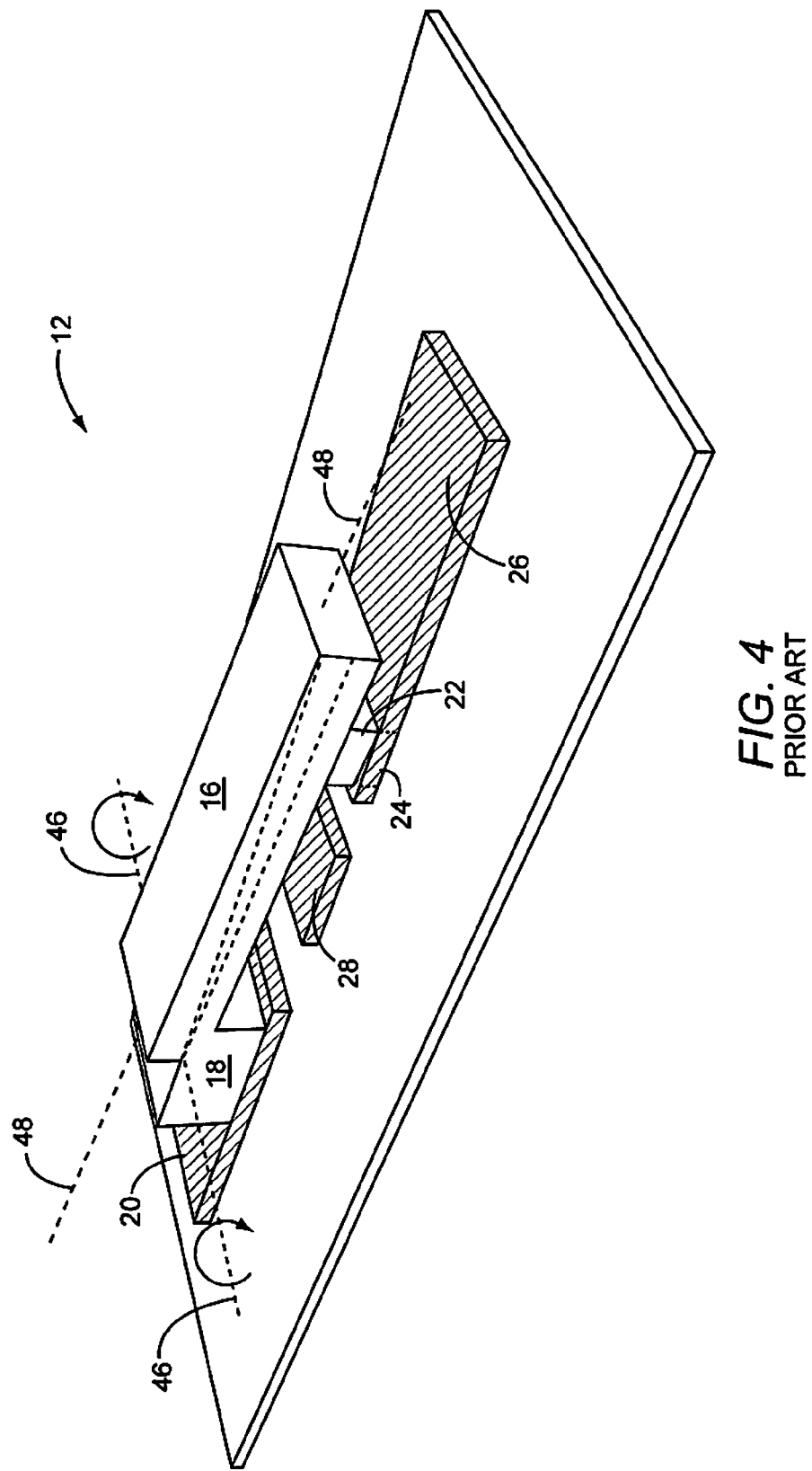
FIG. 4 depicts the failure of the MEMS switch as a result of the thermally induced mechanical stress illustrated in FIG. 3.
Figure 5A:
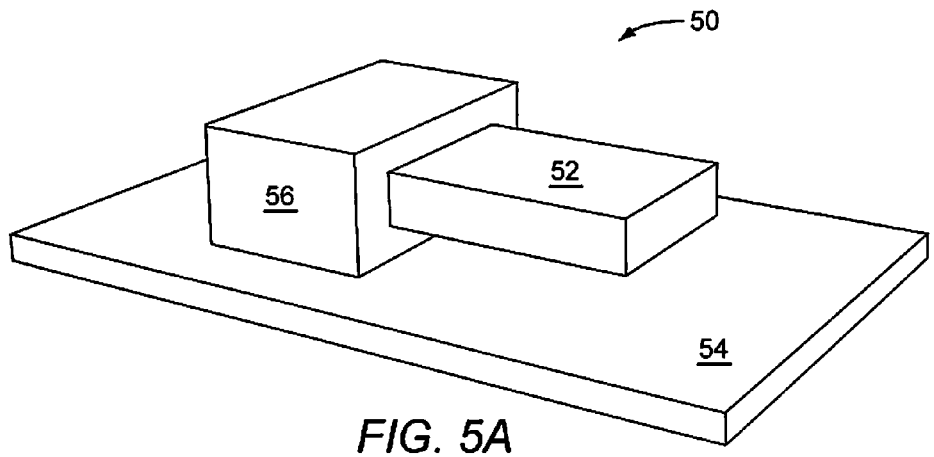
Figure 5B:
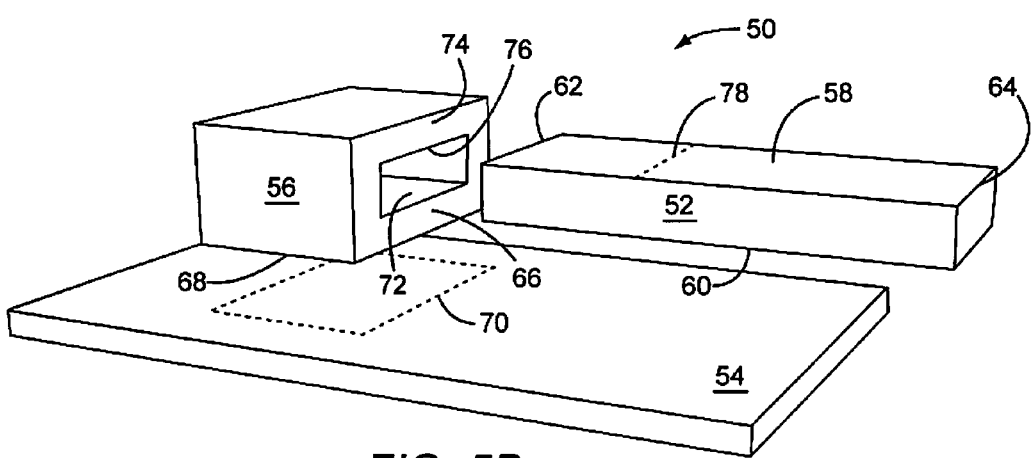
Figure 5C:
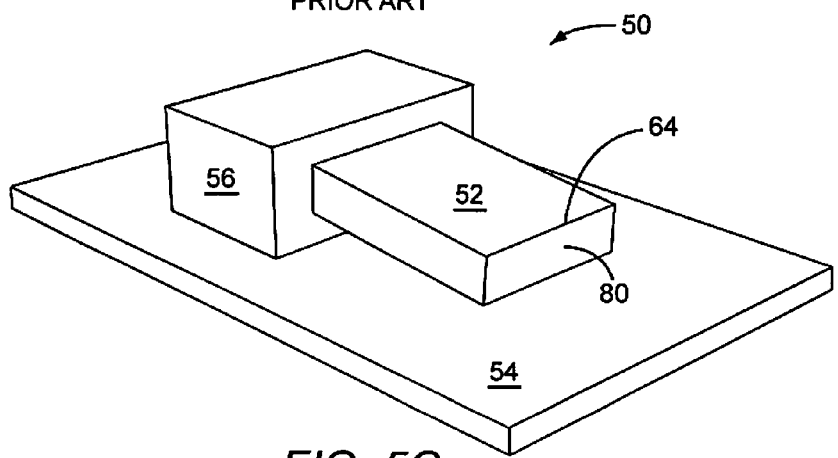

FIGS. 5A, 5B, and 5C depict a typical microstructure device that suffers significant yield loss during manufacturing at elevated temperatures and/or critical parametric shift during operation at varying temperatures.

Figure 6A:
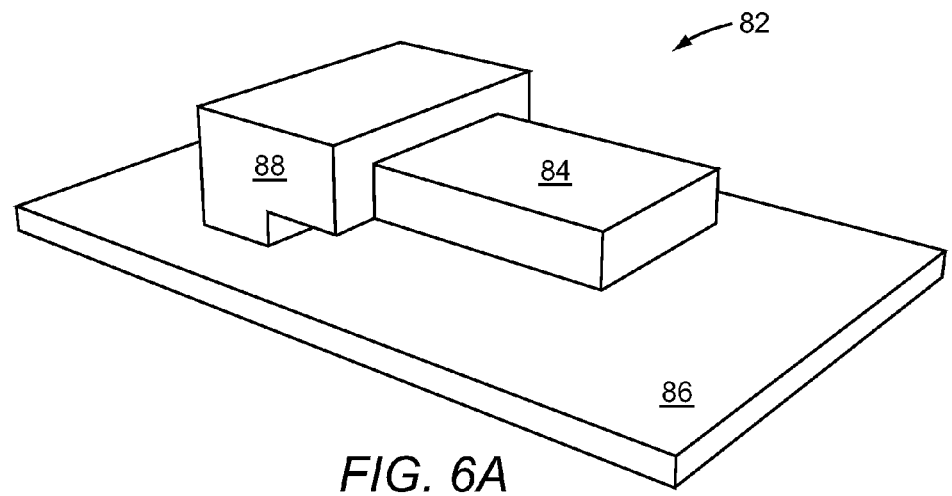
Figure 6B:
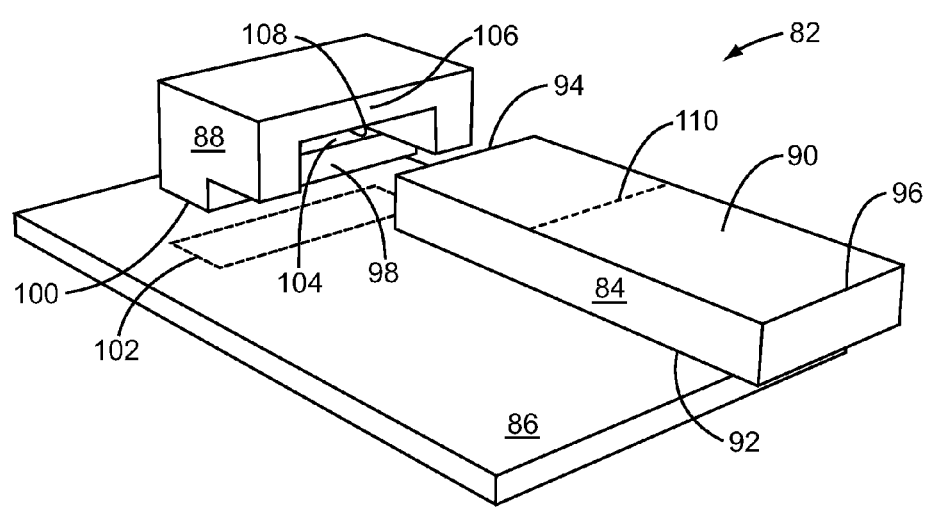
Figure 6C:
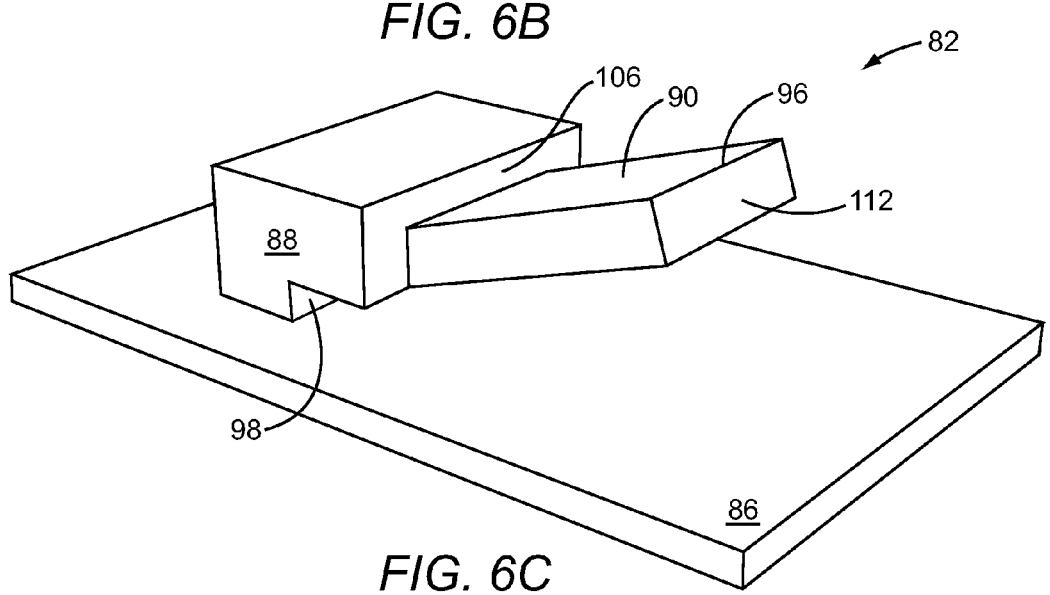

FIGS. 6A, 6B, and 6C depict a microstructure device that, according to the present disclosure, has an anchor with a lower portion having a lateral undercut.

Figure 7A:
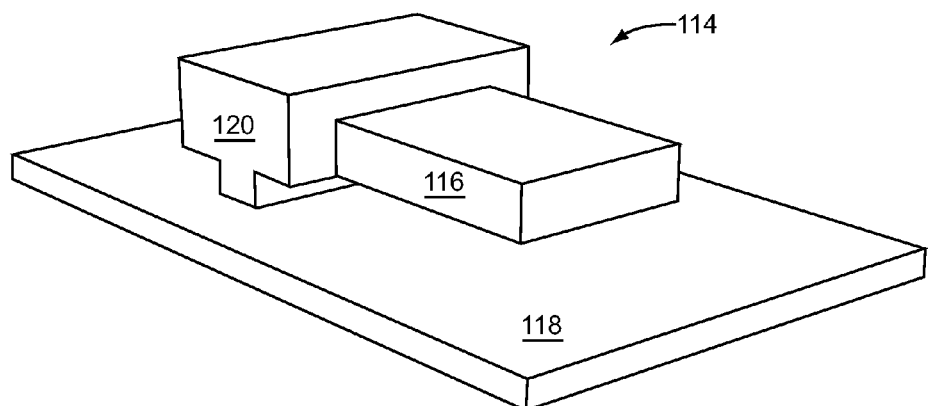
Figure 7B:
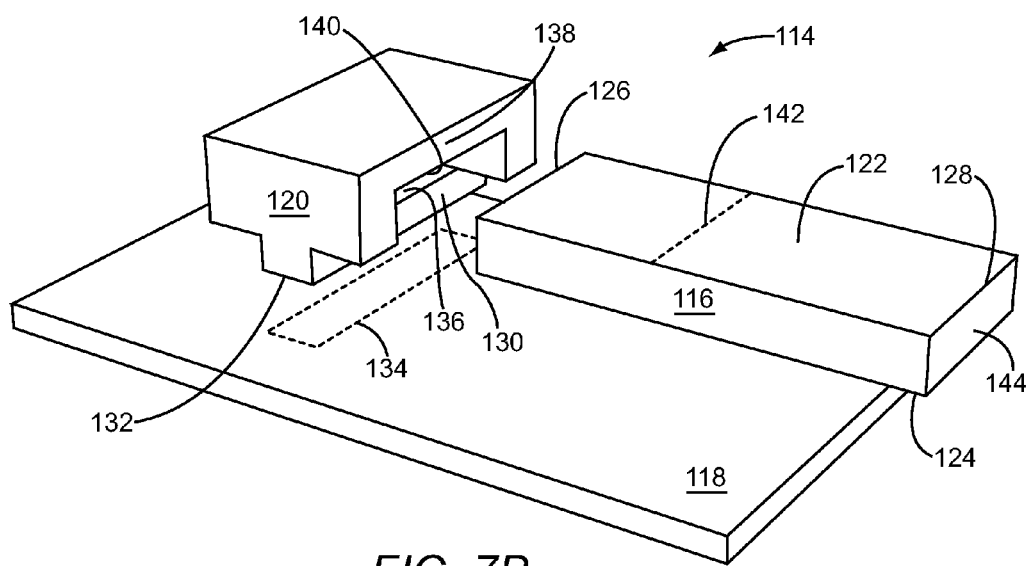
Figure 7C:
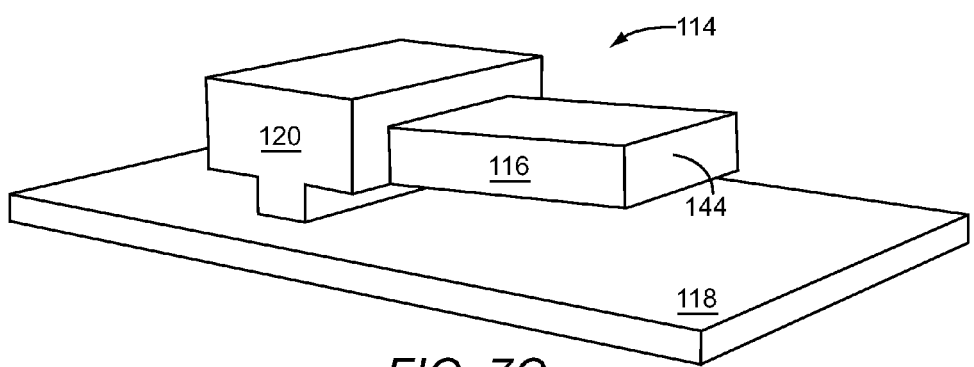

FIGS. 7A, 7B, and 7C depict a microstructure device that, according to the present disclosure, has an anchor with a lower portion having two lateral undercuts on opposite sides of the anchor.

Figure 8A:
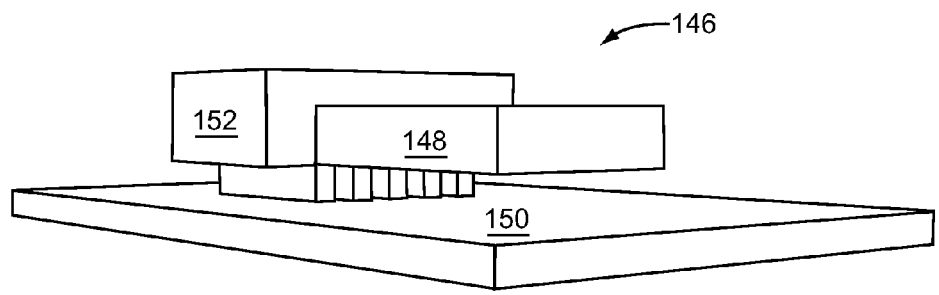
Figure 8B:
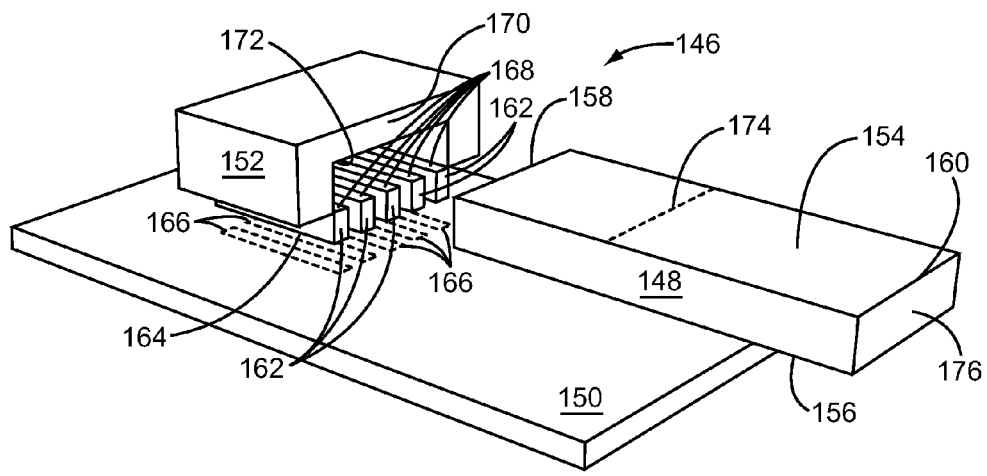
Figure 8C:
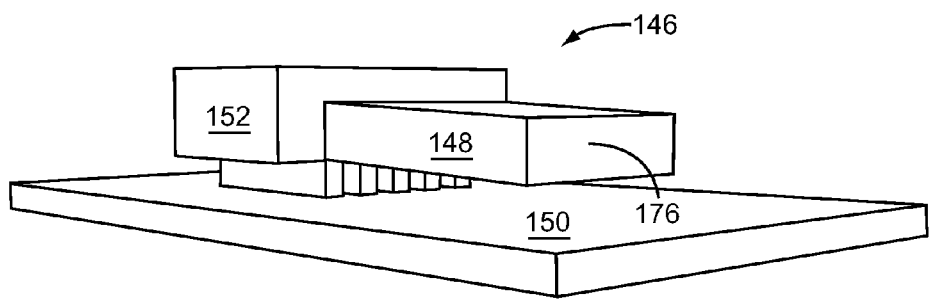

FIGS. 8A, 8B, and 8C depict a microstructure device that, according to the present disclosure, has an anchor with a bottom portion having an upper surface region formed from a plurality of spaced dielectric strips that are oriented longitudinally towards a distal portion of a movable structure supported by the anchor.

Figure 9A:
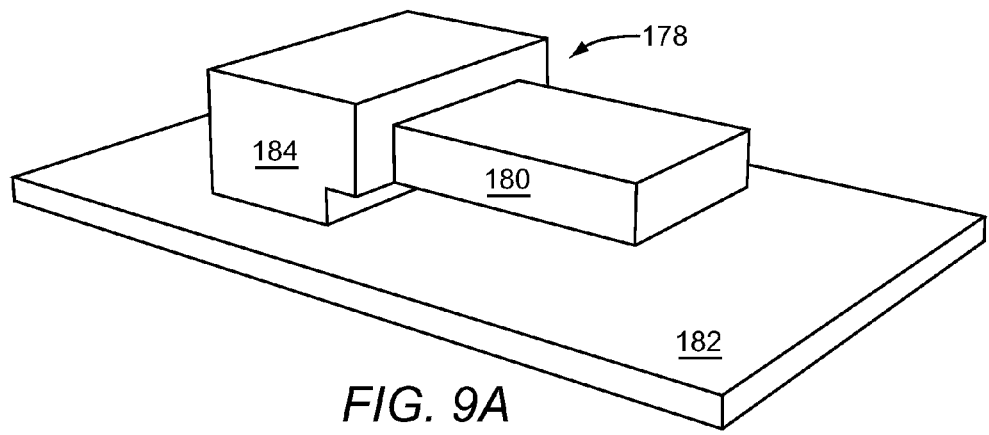
Figure 9B:
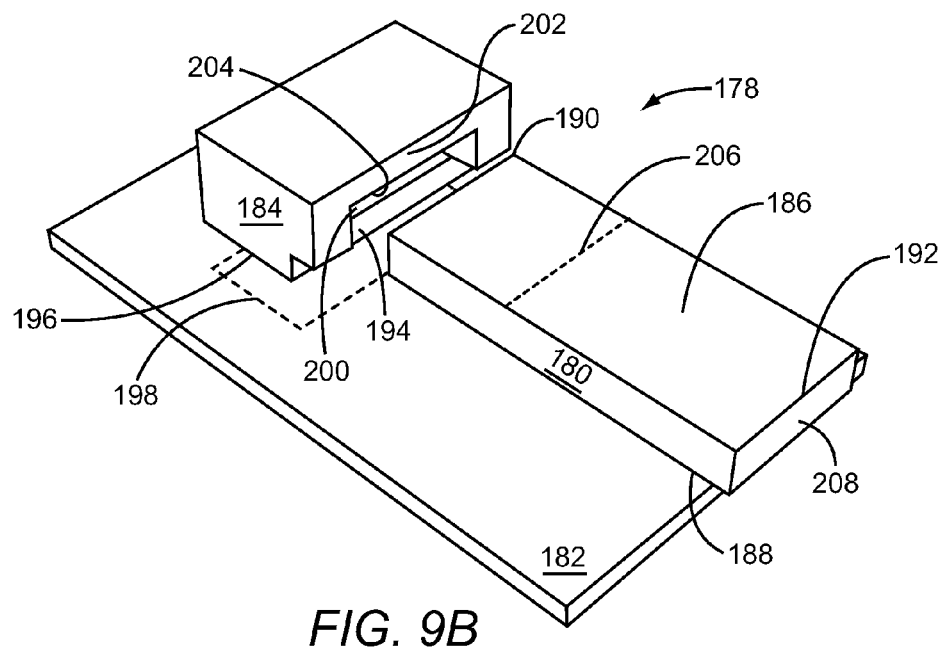
Figure 9C:
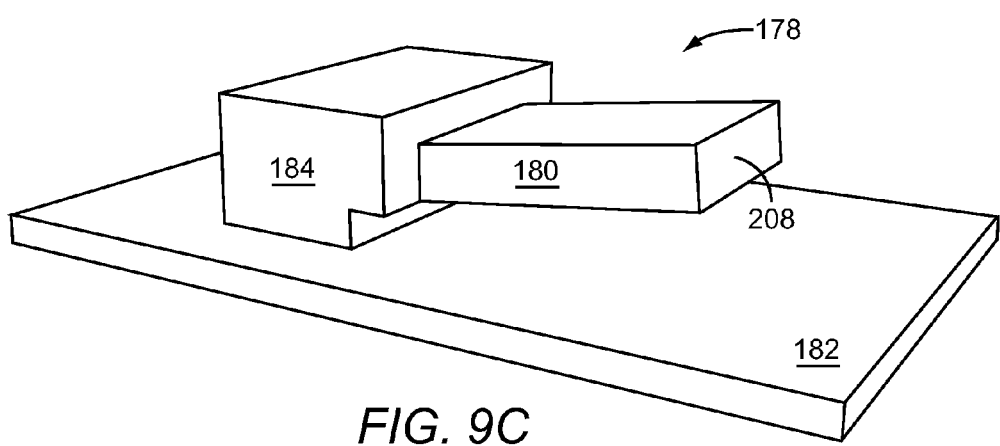

FIGS. 9A, 9B, and 9C depict a microstructure device that, according to the present disclosure, has an anchor with a lower portion having a lateral undercut facing the distal end of the movable structure.

Figure 10A:
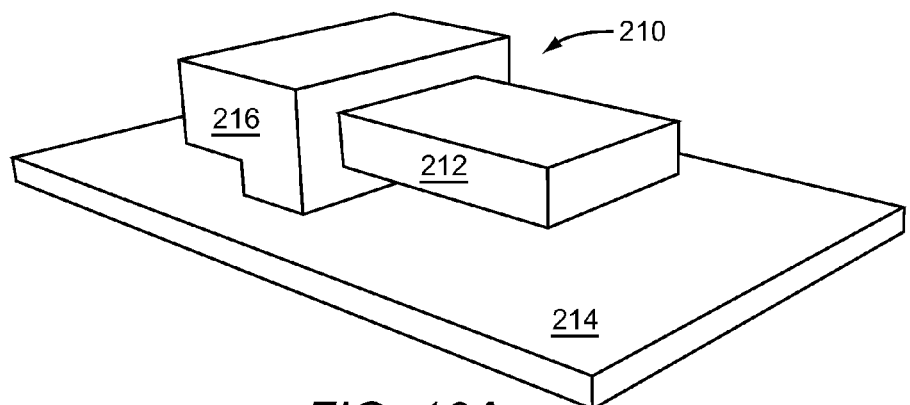
Figure 10B:
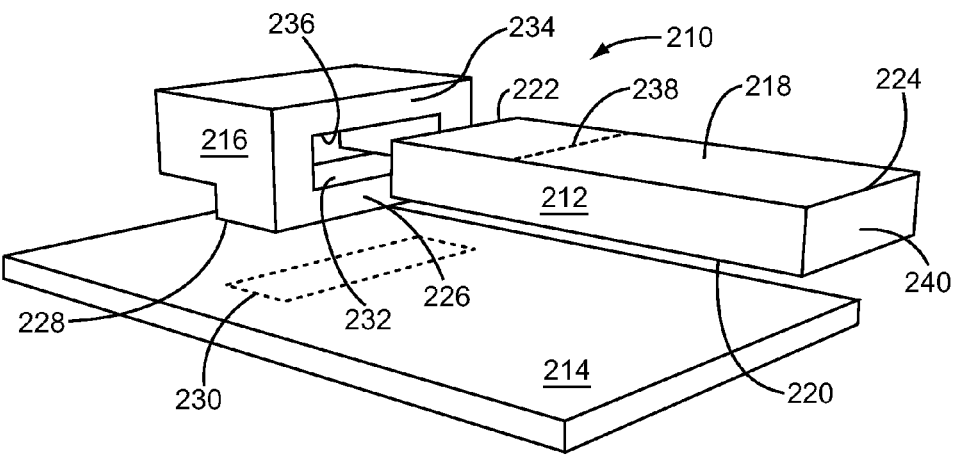
Figure 10C:
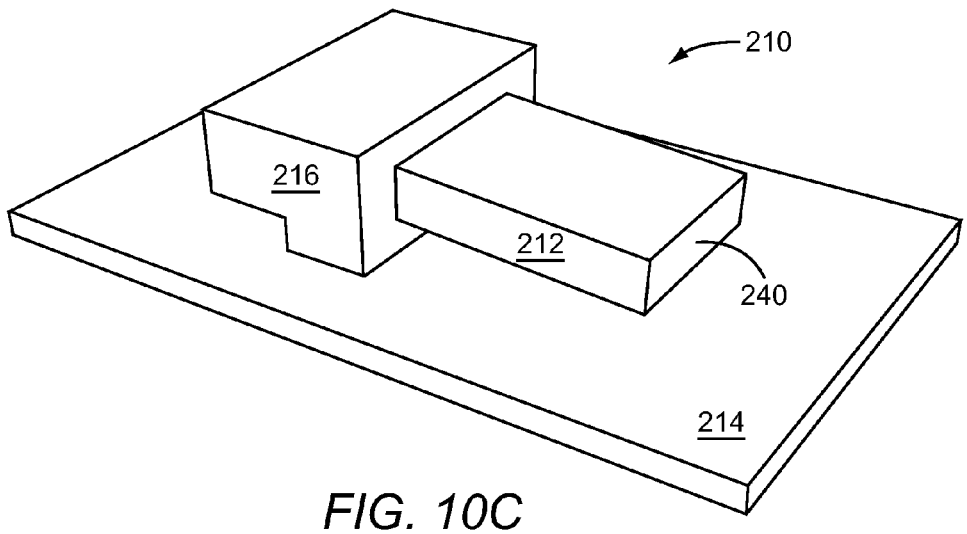

FIGS. 10A, 10B, and 10C depict a microstructure device that, according to the present disclosure, has an anchor with a lower portion having a lateral undercut under the proximal end of the movable structure.

Figure 11A:
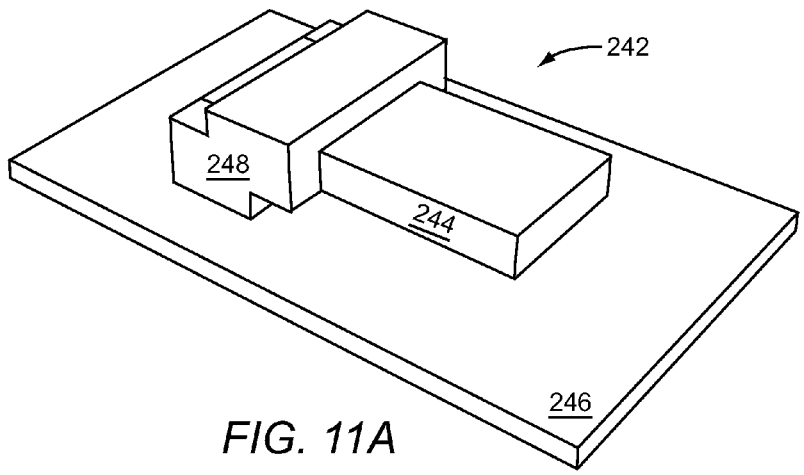
Figure 11B:
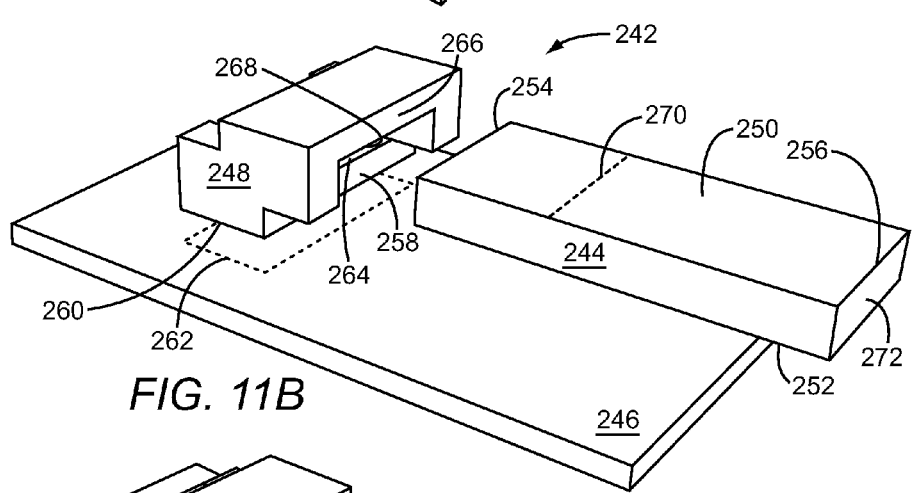
Figure 11C:
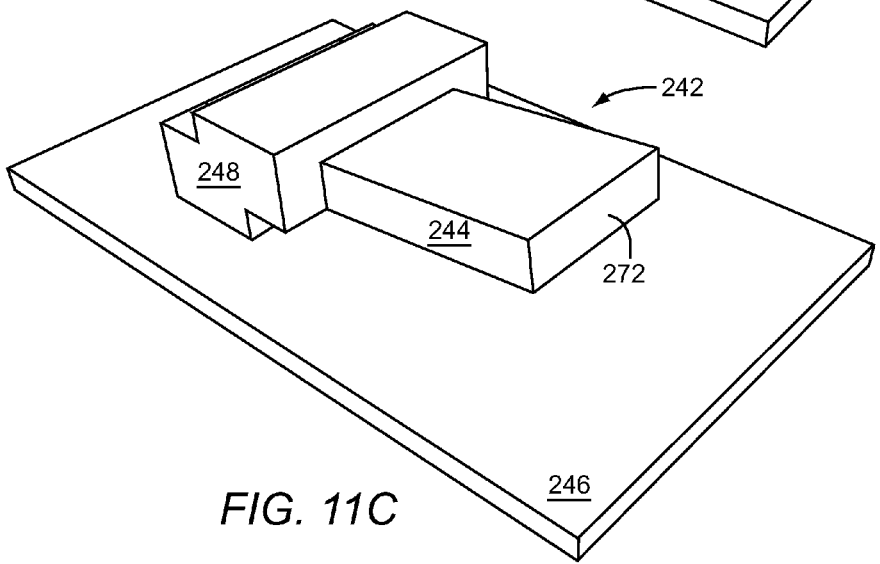

FIGS. 11A, 11B, and 11C depict a microstructure device that, according to the present disclosure, has an anchor with a lower portion having a lateral undercut facing the distal end of the movable structure and a lateral cut in the anchor top portion over the proximal portion of the movable structure.

Figure 12A:
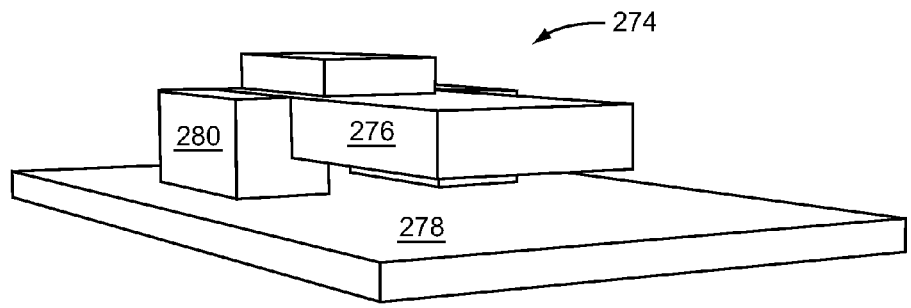
Figure 12B:
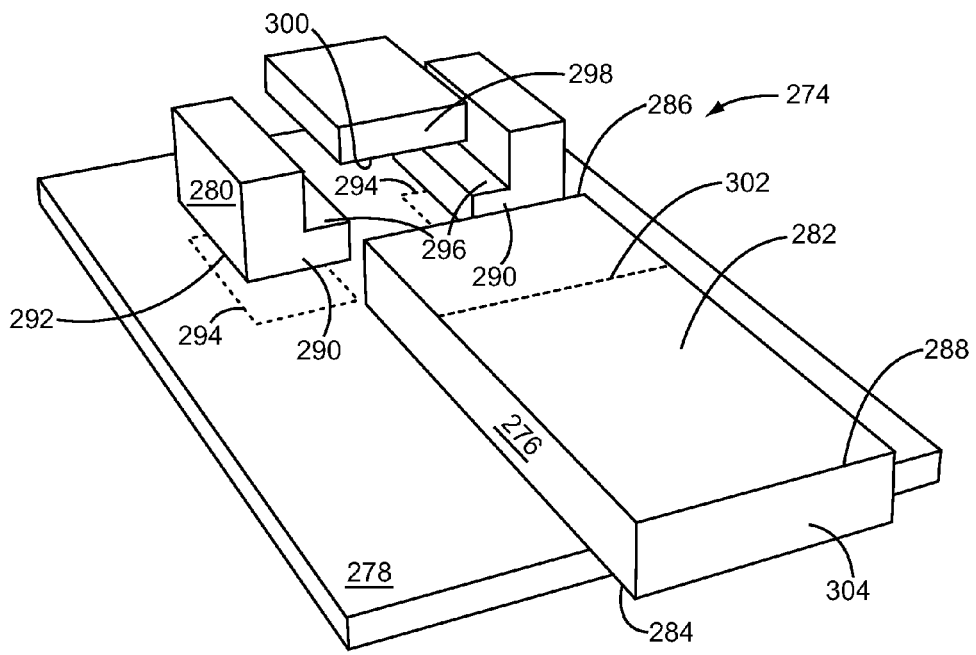
Figure 12C:
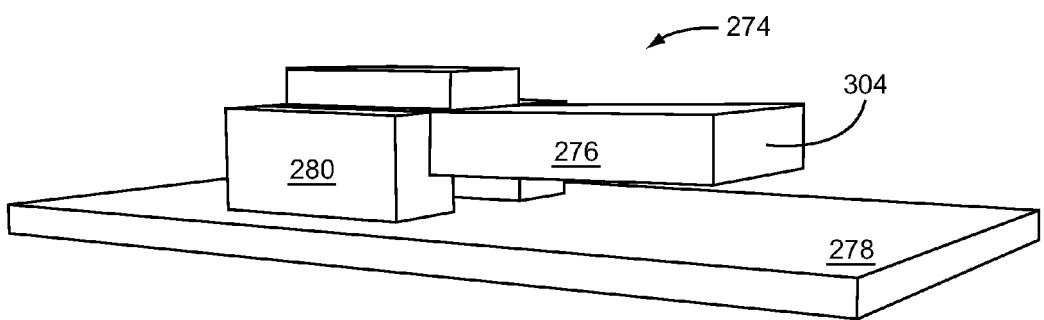

FIGS. 12A, 12B, and 12C depict a microstructure device that, according to the present disclosure, has an anchor with a top portion having a lower area of a lower surface region that is equal in area to an upper area of an upper surface region of a divided and spaced bottom portion, wherein the lower surface region of the top portion does not overlap the spaced bottom portion.

Figure 13A:
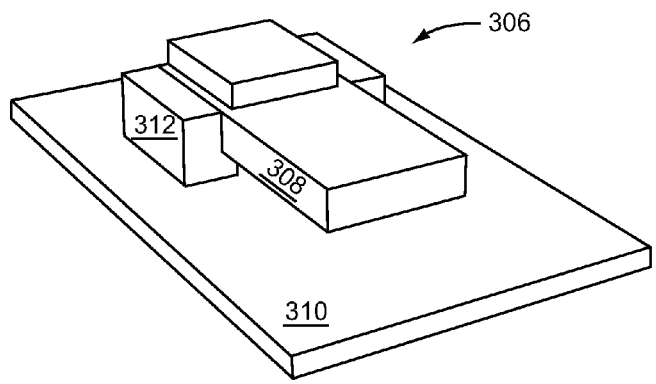
Figure 13B:
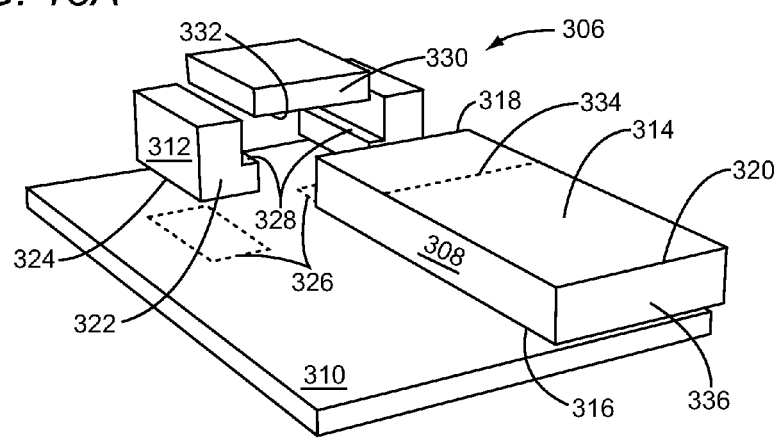
Figure 13C:
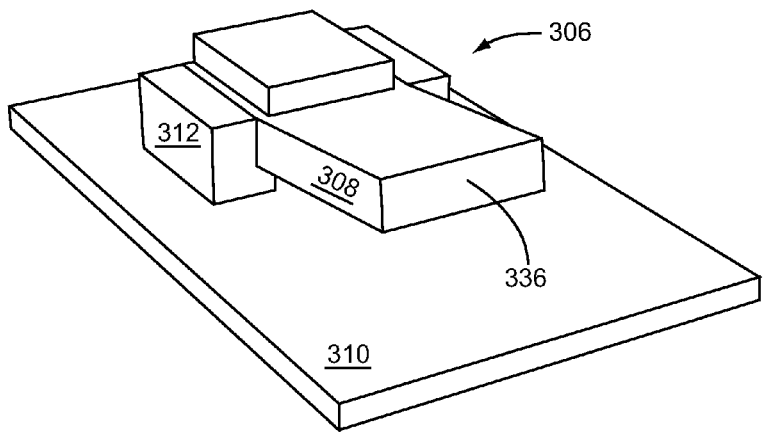

FIGS. 13A, 13B, and 13C depict a microstructure device that, according to the present disclosure, has an anchor with a lower area of a lower surface region of a top portion that is larger than an upper area of an upper surface region of a divided and spaced bottom portion, wherein the lower surface region of the top portion does not overlap the divided and spaced bottom portion.

Figure 14A:
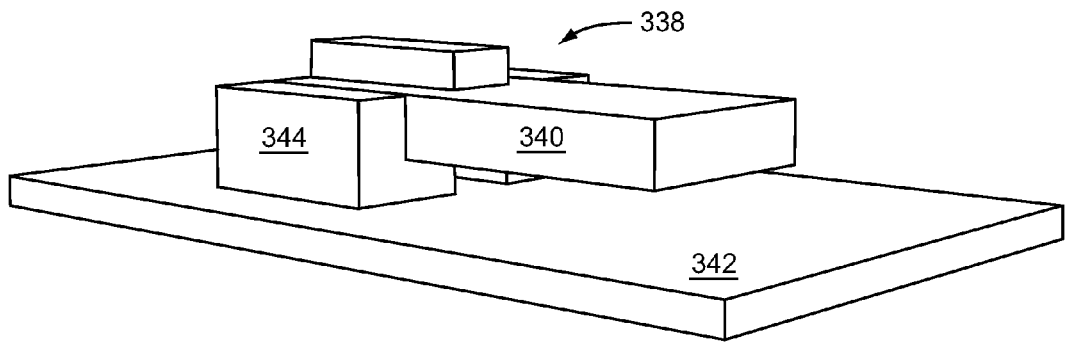
Figure 14B:
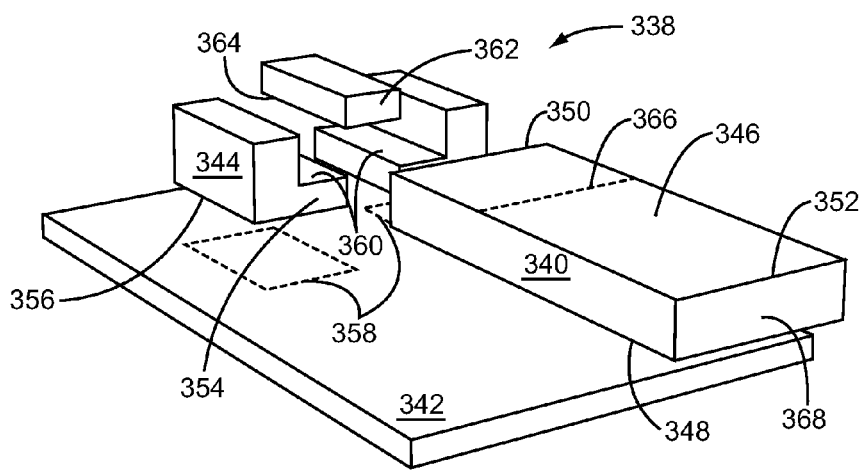
Figure 14C:
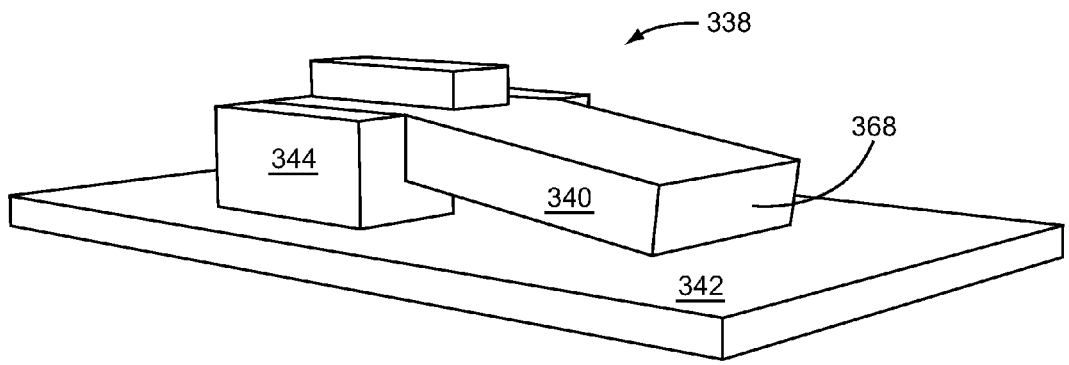

FIGS. 14A, 14B, and 14C depict a microstructure device that, according to the present disclosure, has an anchor with a lower area of a lower surface region of a top portion that is smaller than an upper area of an upper surface region of a divided and spaced bottom portion, wherein the lower surface region does not overlap the divided and spaced bottom portion.

Figure 15A:
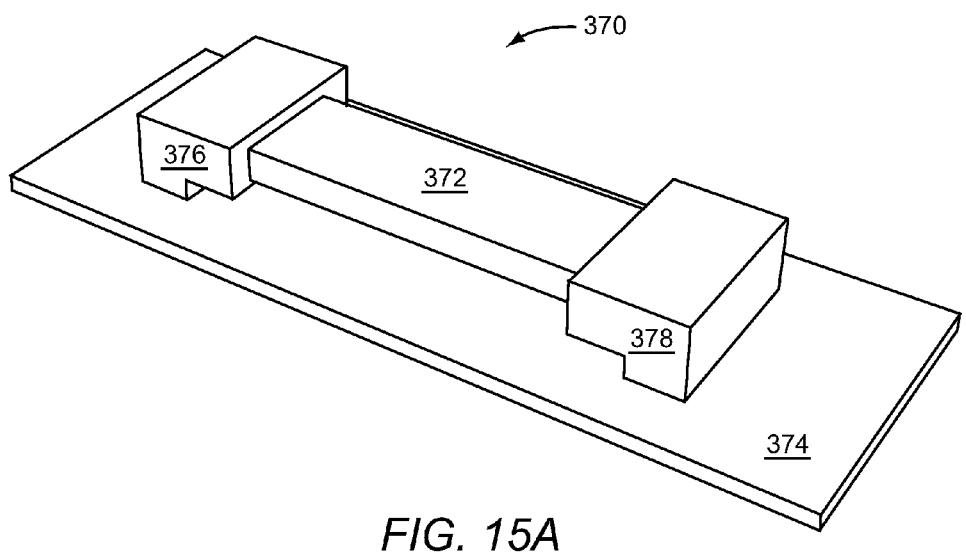
Figure 15B:
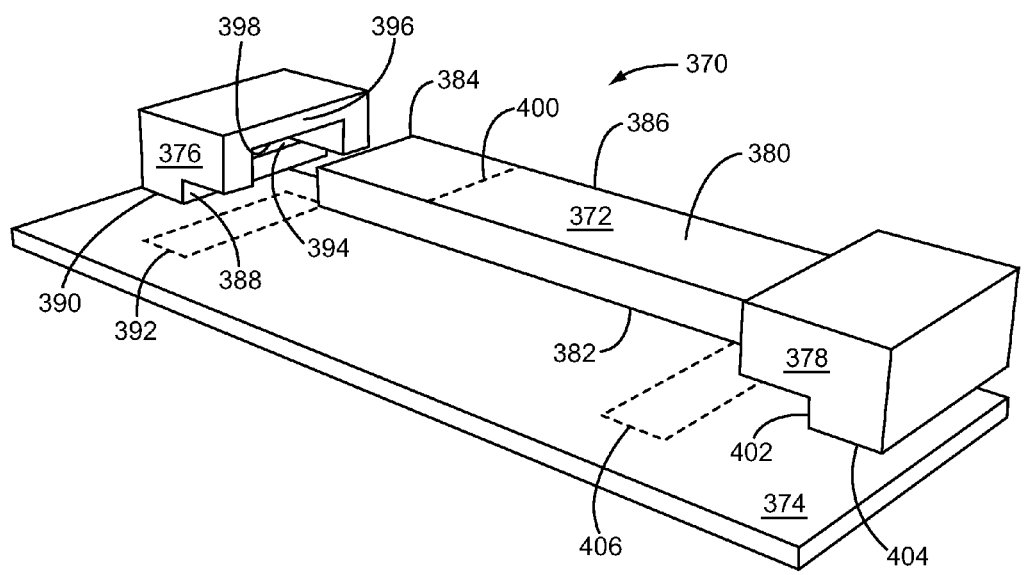

FIGS. 15A and 15B depict a microstructure device that, according to the present disclosure, is a bridge-type structure having a first anchor and a second anchor that hold a movable structure above a substrate.

Figure 16A:
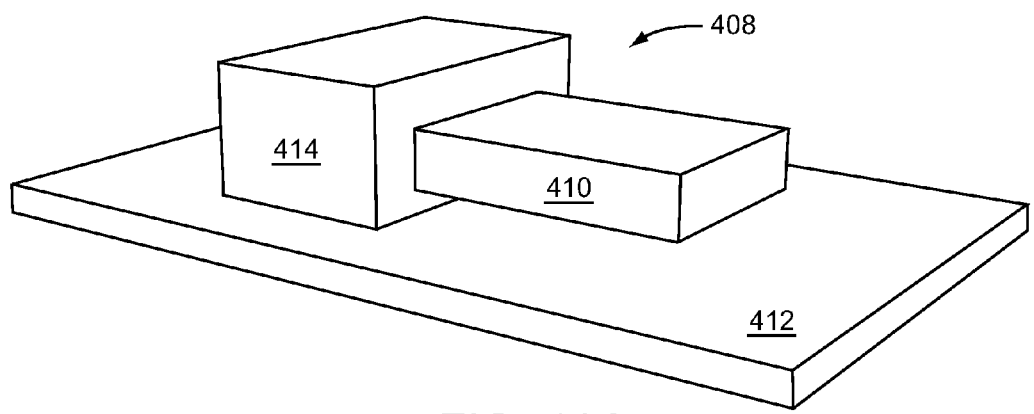
Figure 16B:
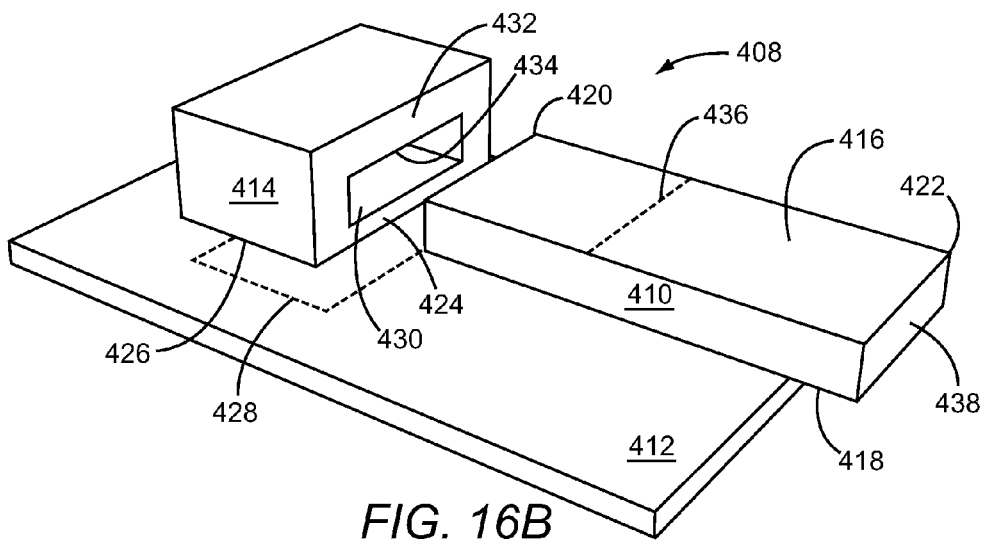
Figure 16C:
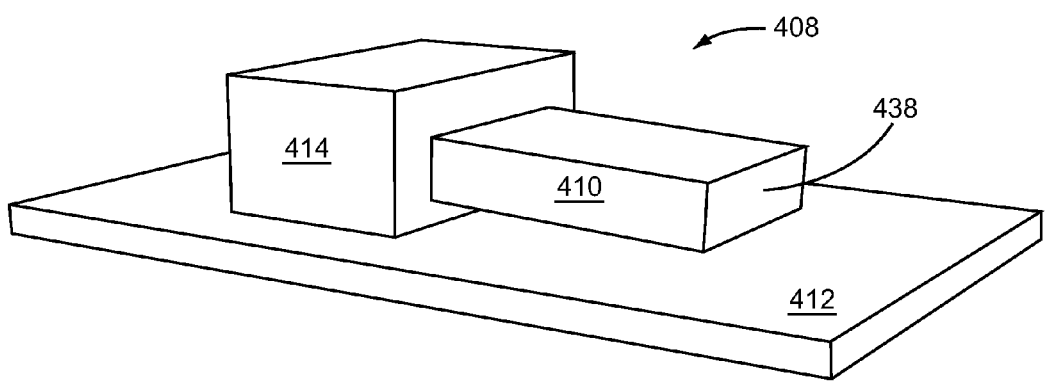

FIGS. 16A, 16B, and 16C depict a microstructure device that, according to the present disclosure, has an anchor with a lower area of a lower surface region that has equal area to an upper area of an upper surface region, wherein the lower surface region is half as thick as the upper surface region.

Figure 17:
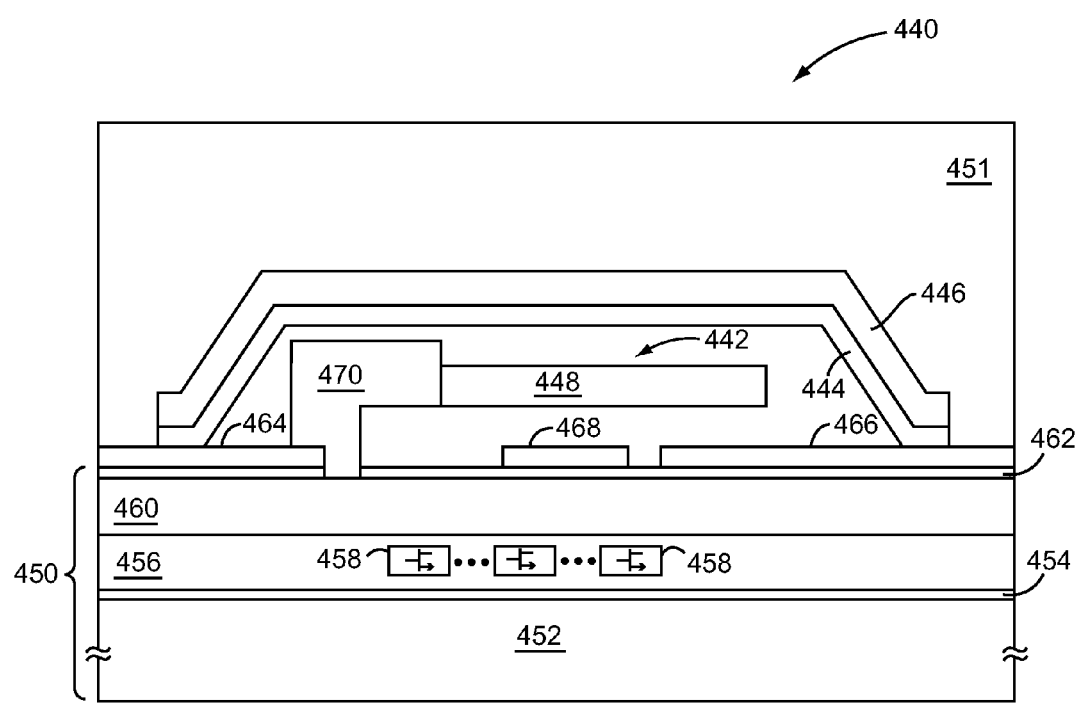

FIG. 17 depicts a microstructure in the form of a MEMS switch that is integrated into a semiconductor device in accordance with the present disclosure.

DETAILED DESCRIPTION

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and accompanying claims.

FIG. 6A depicts a microstructure device 82 that is configured in accordance with the present disclosure. The microstructure device 82 includes a movable structure 84 that is suspended above a substrate 86 by means of an anchor 88. The movable structure 84 may be a conductive beam as typically used in a MEMS switch. The anchor 88 may be formed of a dielectric material such as silicon nitride, silicon oxide, or silicon oxynitride.

FIG. 6B depicts an exploded view of the microstructure device 82. The movable structure 84 has an upper surface 90, a lower surface 92, a proximal portion 94, and a distal portion 96. The anchor 88 includes a bottom portion 98 having a bottom area of a bottom surface region 100 attached to the substrate 86 at a substrate surface area outlined by a dashed box 102. An upper area of an upper surface region 104 of the bottom portion 98 is attached to the lower surface 92 of the proximal portion 94 of the movable structure 84. A top portion 106 has a lower area of a lower surface region 108 attached to the upper surface 90 of the proximal portion 94 of the movable structure 84. A dashed line 110 represents a boundary between the proximal portion 94 of the movable structure 84 that is constrained by the anchor 88, and a free portion of the movable structure 84.

With the microstructure device 82, the upper area of the upper surface region 104 that is attached to the lower surface 92 of the proximal portion 94 of the movable structure 84 is geometrically asymmetric with the lower area of the lower surface region 108 attached to the upper surface 90 of the proximal portion 94. In particular, the upper area of the upper surface region 104 attached to lower surface 92, and the lower area of the lower surface region 108 attached to the upper surface 90 are unequal in area. As shown in FIG. 6B, the area of the upper surface region 104 is about one-half the area of the lower surface region 108. Furthermore, the lower area of the lower surface region 108 attached to upper surface 90 of the movable structure 84 extends further towards the distal portion 96 of the movable structure 84 than does the upper area of the upper surface region 104 of the bottom portion 98.

FIG. 6C depicts the results of a finite element simulation of mechanical effects experienced by the microstructure device 82 when the microstructure device 82 is heated during manufacturing or operation. During the finite element simulation, an unconstrained length of the movable structure 84 was set to around 125 micrometers (µm), whereas a constrained length of the movable structure 84 was set to around 30 µm. The results of the finite element simulation show that a tip 112 of the movable structure 84 will extend away from the substrate 86 by around 2.3 µm when heated to a steady state temperature of 400° C.

FIG. 7A depicts a microstructure device 114 that is configured in accordance with the present disclosure. The microstructure device 114 includes a movable structure 116 that is suspended above a substrate 118 by means of an anchor 120. The movable structure 116 may be a conductive beam as typically used in a MEMS switch. The anchor 120 may be formed of a dielectric material such as silicon nitride, silicon oxide, or silicon oxynitride.

FIG. 7B depicts an exploded view of the microstructure device 114. The movable structure 116 has an upper surface 122, a lower surface 124, a proximal portion 126, and a distal portion 128. The anchor 120 includes a bottom portion 130 having a bottom area of a bottom surface region 132 attached to the substrate 118 at a substrate surface area outlined by a dashed box 134. An upper area of an upper surface region 136 of the bottom portion 130 is attached to the lower surface 124 of the proximal portion 126 of the movable structure 116. A top portion 138 has a lower area of a lower surface region 140 attached to the upper surface 122 of the proximal portion 126 of the movable structure 116. A dashed line 142 represents a boundary between the proximal portion 126 of the movable structure 116 that is constrained by the anchor 120, and a free portion of the movable structure 116.

With the microstructure device 114, the upper area of the upper surface region 136 that is attached to the lower surface 124 of the proximal portion 126 of the movable structure 116 is geometrically asymmetric with the lower area of the lower surface region 140 attached to the upper surface 122 of the proximal portion 126. In particular, the upper area of the upper surface region 136 attached to the lower surface 124, and the lower area of the lower surface region 140 attached to the upper surface 122 are unequal in area. As shown in FIG. 7B, the area of the upper surface region 136 of the bottom portion 130 is about one-third the area of the lower surface region 140 of the top portion 138. Furthermore, the lower area of the lower surface region 140 of the top portion 138 attached to the upper surface 122 of the movable structure 116 extends further towards the distal portion 128 of the movable structure 116 than does the upper area of the upper surface region 136 of the bottom portion 130. Moreover, the lower area of lower surface region 140 of the top portion 138 attached to upper surface 122 of the movable structure 116 extends further over the proximal portion 126 of the movable structure 116 than does the upper area of the upper surface region 136 of the bottom portion 130 attached to the lower surface 124 of the movable structure 116.

FIG. 7C depicts the results of a finite element simulation of mechanical effects experienced by the microstructure device 114 when the microstructure device 114 is heated during manufacturing or operation. During the finite element simulation, an unconstrained length of the movable structure 116 was set to around 125 µm, whereas a constrained length of the movable structure 116 was set to around 30 µm. The results of the finite element simulation show that a tip 144 of the movable structure 116 will extend away from the substrate 118 by around 0.7 µm when heated to a steady state temperature of 400° C.

FIG. 8A depicts a microstructure device 146 that is configured in accordance with the present disclosure. The microstructure device 146 includes a movable structure 148 that is suspended above a substrate 150 by means of an anchor 152. The movable structure 148 may be a conductive beam as typically used in a MEMS switch. The anchor 152 may be formed of a dielectric material such as silicon nitride, silicon oxide, or silicon oxynitride.

FIG. 8B depicts an exploded view of the microstructure device 146. The movable structure 148 has an upper surface 154, a lower surface 156, a proximal portion 158, and a distal portion 160. The anchor 152 includes a bottom portion 162 having a bottom area of a bottom surface region 164 attached to the substrate 150 at a substrate surface area outlined by dashed boxes 166. The bottom area of the bottom surface region 164 is made up of a plurality of spaced longitudinal strips as depicted by the dashed boxes 166. An upper area of an upper surface region 168 of the bottom portion 162 is attached to the lower surface 156 of the proximal portion 158 of the movable structure 148. The upper area of the upper surface region 168 is also made up of a plurality of spaced longitudinal strips. A top portion 170 has a lower area of a lower surface region 172 attached to the upper surface 154 of the proximal portion 158 of the movable structure 148. A dashed line 174 represents a boundary between the proximal portion 158 of the movable structure 148 that is constrained by the anchor 152, and a free portion of the movable structure 148.

With the microstructure device 146, the upper area of the upper surface region 168 that is attached to the lower surface 156 of the proximal portion 158 of the movable structure 148 is geometrically asymmetric with the lower area of the lower surface region 172 attached to the upper surface 154 of the proximal portion 158. In particular, the upper area of the upper surface region 168 attached to lower surface 156, and the lower area of the lower surface region 172 attached to the upper surface 154 are unequal in area due to the spaced longitudinal strips making up the upper surface region 168.

FIG. 8C depicts the results of a finite element simulation of mechanical effects experienced by the microstructure device 146 when the microstructure device 146 is heated during manufacturing or operation. During the finite element simulation, an unconstrained length of the movable structure 148 was set to around 125 µm, whereas a constrained length of the movable structure 148 was set at around 30 µm. The results of the finite element simulation show that a tip 176 of the movable structure 148 will droop towards the substrate 150 by around 0.3 µm when heated to a steady state temperature of 400° C.

FIG. 9A depicts a microstructure device 178 that is configured in accordance with the present disclosure. The microstructure device 178 includes a movable structure 180 that is suspended above a substrate 182 by means of an anchor 184. The movable structure 180 may be a conductive beam as typically used in a MEMS switch. The anchor 184 may be formed of a dielectric material such as silicon nitride, silicon oxide, or silicon oxynitride.

FIG. 9B depicts an exploded view of the microstructure device 178.

The movable structure 180 has an upper surface 186, a lower surface 188, a proximal portion 190, and a distal portion 192. The anchor 184 includes a bottom portion 194 having a bottom area of a bottom surface region 196 attached to the substrate 182 at a substrate surface area outlined by a dashed box 198. An upper area of an upper surface region 200 of the bottom portion 194 is attached to the lower surface 188 of the proximal portion 190 of the movable structure 180. A top portion 202 has a lower area of a lower surface region 204 attached to the upper surface 186 of the proximal portion 190 of the movable structure 180. A dashed line 206 represents a boundary between the proximal portion 190 of the movable structure 180 that is constrained by the anchor 184, and a free portion of the movable structure 180.

With the microstructure device 178, the upper area of the upper surface region 200 that is attached to the lower surface 188 of the proximal portion 190 of the movable structure 180 is geometrically asymmetric with the lower area of the lower surface region 204 attached to the upper surface 186 of the proximal portion 190. In particular, the upper area of the upper surface region 200 attached to lower surface 188, and the lower area of the lower surface region 204 attached to the upper surface 186 are unequal in area. As shown in FIG. 9B, the area of the upper surface region 200 is about five-sixths the area of the lower surface region 204. Furthermore, the lower area of the lower surface region 204 attached to upper surface 186 of the movable structure 180 extends further towards the distal portion 192 of the movable structure 180 than does the upper area of the upper surface region 200.

FIG. 9C depicts the results of a finite element simulation of mechanical effects experienced by the microstructure device 178 when the microstructure device 178 is heated during manufacturing or operation. During the finite element simulation, an unconstrained length of the movable structure 180 was set at around 125 µm, whereas a constrained length of the movable structure 180 was set at around 30 µm. The results of the finite element simulation shows that a tip 208 of the movable structure 180 will extend away from the substrate 182 by around 0.6 µm when heated to a steady state temperature of 400° C.

FIG. 10A depicts a microstructure device 210 that is configured in accordance with the present disclosure. The microstructure device 210 includes a movable structure 212 that is suspended above a substrate 214 by means of an anchor 216. The movable structure 212 may be a conductive beam as typically used in a MEMS switch. The anchor 216 may be formed of a dielectric material such as silicon nitride, silicon oxide, or silicon oxynitride.

FIG. 10B depicts an exploded view of the microstructure device 210. The movable structure 212 has an upper surface 218, a lower surface 220, a proximal portion 222 and a distal portion 224. The anchor 216 includes a bottom portion 226 having a bottom area of a bottom surface region 228 attached to the substrate 214 at a substrate surface area outlined by a dashed box 230. An upper area of an upper surface region 232 of the bottom portion 226 is attached to the lower surface 220 of the proximal portion 222 of the movable structure 212. A top portion 234 has a lower area of a lower surface region 236 attached to the upper surface 218 of the proximal portion 222 of the movable structure 212. A dashed line 238 represents a boundary between the proximal portion 222 of the movable structure 212 that is constrained by the anchor 216, and a free portion of the movable structure 212.

With the microstructure device 210, the upper area of the upper surface region 232 that is attached to the lower surface 220 of the proximal portion 222 of the movable structure 212 is geometrically asymmetric with the lower area of the lower surface region 236 attached to the upper surface 218 of the proximal portion 222. In particular, the upper area of the upper surface region 232 attached to lower surface 220, and the lower area of the lower surface region 236 attached to the upper surface 218 are unequal in area. As shown in FIG. 10B, the area of the upper surface region 232 of the bottom portion 226 is about one-half the area of the lower surface region 236 of the top portion 234. Furthermore, the lower area of the lower surface region 236 attached to the upper surface 218 of the movable structure 212 extends further away from the distal portion 224 of the movable structure 212 than does the upper area of the upper surface region 232 of the bottom portion 226.

FIG. 10C depicts the results of a finite element simulation of the mechanical effects experienced by the microstructure device 210 when the microstructure device 210 is heated during manufacturing or operation. During the finite element simulation, an unconstrained length of the movable structure 212 was set to around 125 µm, whereas a constrained length of the movable structure 212 was set to around 30 µm. The results of the finite element simulation show that a tip 240 of the movable structure 212 will droop towards the substrate 214 by around 0.5 µm when heated to a steady state temperature of 400° C.

FIG. 11A depicts a microstructure device 242 that is configured in accordance with the present disclosure. The microstructure device 242 includes a movable structure 244 that is suspended above a substrate 246 by means of an anchor 248. The movable structure 244 may be a conductive beam as typically used in a MEMS switch. The anchor 248 may be formed of a dielectric material such as silicon nitride, silicon oxide, or silicon oxynitride.

FIG. 11B depicts an exploded view of the microstructure device 242. The movable structure 244 has an upper surface 250, a lower surface 252, a proximal portion 254, and a distal portion 256. The anchor 248 includes a bottom portion 258 having a bottom area of a bottom surface region 260 attached to the substrate 246 at a substrate surface area outlined by a dashed box 262. An upper area of an upper surface region 264 of the bottom portion 258 is attached to the lower surface 252 of the proximal portion 254 of the movable structure 244. A top portion 266 has a lower area of a lower surface region 268 attached to the upper surface 250 of the proximal portion 254 of the movable structure 244. A dashed line 270 represents a boundary between the proximal portion 254 of the movable structure 244 that is constrained by the anchor 248, and a free portion of the movable structure 244.

With the microstructure device 242, the upper area of the upper surface region 264 that is attached to the lower surface 252 of the proximal portion 254 of the movable structure 244 is geometrically asymmetric with the lower area of the lower surface region 268 attached to the upper surface 250 of the proximal portion 254. In this particular configuration, the upper area of the upper surface region 264 attached to the lower surface 252, and the lower area of the lower surface region 268 attached to the upper surface 250 are equal in area. However, the lower area of the lower surface region 268 attached to the upper surface 250 of the movable structure 244 extends further towards the distal portion 256 of the movable structure 244 than does the upper area of the upper surface region 264 of the bottom portion 258. Moreover, when assembled, the upper area of the upper surface region 264 extends further towards the proximal portion 254 of the movable structure 244 than does the lower area of the lower surface region 268 attached to the upper surface 250 of the movable structure 244.

FIG. 11C depicts the results of a finite element simulation of mechanical effects experienced by the microstructure device 242 when the microstructure device 242 is heated during manufacturing or operation. During the finite element simulation, an unconstrained length of the movable structure 244 was set to around 125 µm, whereas a constrained length of the movable structure 244 was set to around 30 µm. The results of the finite element simulation show that a tip 272 of the movable structure 244 will extend away from the substrate 246 by around 0.8 µm when heated to a steady state temperature of 400° C.

FIG. 12A depicts a microstructure device 274 that is configured in accordance with the present disclosure. The microstructure device 274 includes a movable structure 276 that is suspended above a substrate 278 by means of an anchor 280. The movable structure 276 may be a conductive beam as typically used in a MEMS switch. The anchor 280 may be formed of a dielectric material such as silicon nitride, silicon oxide, or silicon oxynitride.

FIG. 12B depicts an exploded view of the microstructure device 274. The movable structure 276 has an upper surface 282, a lower surface 284, a proximal portion 286, and a distal portion 288. The anchor 280 includes a bottom portion 290 having a bottom area of a bottom surface region 292 attached to the substrate 278 at a substrate surface area outlined by dashed boxes 294. An upper area of an upper surface region 296 of the bottom portion 290 is attached to the lower surface 284 of the proximal portion 286 of the movable structure 276. A top portion 298 has a lower area of a lower surface region 300 attached to the upper surface 282 of the proximal portion 286 of the movable structure 276. A dashed line 302 represents a boundary between the proximal portion 286 of the movable structure 276 that is constrained by the anchor 280, and a free portion of the movable structure 276.

With the microstructure device 274, the upper area of the upper surface region 296 that is attached to the lower surface 284 of the proximal portion 286 of the movable structure 276 is geometrically asymmetric with the lower area of the lower surface region 300 attached to the upper surface 282 of the proximal portion 286. In this particular configuration, the upper area of the upper surface region 296 attached to lower surface 284, and the lower area of the lower surface region 300 attached to the upper surface 282 are equal in area. However, the bottom portion 290 is divided and spaced such that the lower area of the lower surface region 300 of the top portion 298 does not overlap the upper area of the upper surface region 296 of the bottom portion 290. FIG. 12C depicts the results of a finite element simulation of mechanical effects experienced by the microstructure device 274 when the microstructure device 274 is heated during manufacturing or operation. During the finite element simulation, an unconstrained length of the movable structure 276 was set to around 125 µm, whereas a constrained length of the movable structure 276 was set at around 30 µm. The results of the finite element simulation shows that a tip 304 of the movable structure 276 will extend away from the substrate 278 by around 0.14 µm when heated to a steady state temperature of 400° C.

FIG. 13A depicts a microstructure device 306 that is configured in accordance with the present disclosure. The microstructure device 306 includes a movable structure 308 that is suspended above a substrate 310 by means of an anchor 312. The movable structure 308 may be a conductive beam as typically used in a MEMS switch. The anchor 312 may be formed of a dielectric material such as silicon nitride, silicon oxide, or silicon oxynitride.

FIG. 13B depicts an exploded view of the microstructure device 306. The movable structure 308 has an upper surface 314, a lower surface 316, a proximal portion 318, and a distal portion 320. The anchor 312 includes a bottom portion 322 having a bottom area of a bottom surface region 324 attached to the substrate 310 at a substrate surface area outlined by dashed boxes 326. An upper area of an upper surface region 328 of the bottom portion 322 is attached to the lower surface 316 of the proximal portion 318 of the movable structure 308. A top portion 330 has a lower area of a lower surface region 332 attached to the upper surface 314 of the proximal portion 318 of the movable structure 308. A dashed line 334 represents a boundary between the proximal portion 318 of the movable structure 308 that is constrained by the anchor 312, and a free portion of the movable structure 308.

With the microstructure device 306, the upper area of the upper surface region 328 that is attached to the lower surface 316 of the proximal portion 318 of the movable structure 308 is geometrically asymmetric with the lower area of the lower surface region 332 attached to the upper surface 314 of the proximal portion 318. In particular, the upper area of the upper surface region 328 attached to lower surface 316, and the lower area of the lower surface region 332 attached to the upper surface 314 are unequal in area. As shown in FIG. 13B, the lower area of the lower surface region 332 of the top portion 330 is significantly larger than the upper surface area of the upper surface region 328 of the bottom portion 322. Moreover, the bottom portion 322 is divided and spaced such that the lower area of the lower surface region 332 of the top portion 330 does not overlap the upper area of the upper surface region 328 of the bottom portion 322. FIG. 13C depicts the results of a finite element simulation of mechanical effects experienced by the microstructure device 306 when the microstructure device 306 is heated during manufacturing or operation. During the finite element simulation, an unconstrained length of the movable structure 308 was set to around 125 μm, whereas a constrained length of the movable structure 308 was set at around 30 μm. The results of the finite element simulation shows that a tip 336 of the movable structure 308 will extend away from the substrate 310 by around 1.4 μm when heated to a steady state temperature of 400° C.

FIG. 14A depicts a microstructure device 338 that is configured in accordance with the present disclosure. The microstructure device 338 includes a movable structure 340 that is suspended above a substrate 342 by means of an anchor 344. The movable structure 340 may be a conductive beam as typically used in a MEMS switch. The anchor 344 may be formed of a dielectric material such as silicon nitride, silicon oxide, or silicon oxynitride.

FIG. 14B depicts an exploded view of the microstructure device 338. The movable structure 340 has an upper surface 346, a lower surface 348, a proximal portion 350, and a distal portion 352. The anchor 344 includes a bottom portion 354 having a bottom area of a bottom surface region 356 attached to the substrate 342 at a substrate surface area outlined by a dashed box 358. An upper area of an upper surface region 360 of the bottom portion 354 is attached to the lower surface 348 of the proximal portion 350 of the movable structure 340. A top portion 362 has a lower area of a lower surface region 364 attached to the upper surface 346 of the proximal portion 350 of the movable structure 340. A dashed line 366 represents a boundary between the proximal portion 350 of the movable structure 340 that is constrained by the anchor 344, and a free portion of the movable structure 340.

With the microstructure device 338, the upper area of the upper surface region 360 that is attached to the lower surface 348 of the proximal portion 350 of the movable structure 340 is geometrically asymmetric with the lower area of the lower surface region 364 attached to the upper surface 346 of the proximal portion 350. In particular, the upper area of the upper surface region 360 attached to lower surface 348, and the lower area of the lower surface region 364 attached to the upper surface 346 are unequal in area. As shown in FIG. 14B, the area of the upper surface region 360 of the bottom portion 354 is about twice the area of the lower surface region 364 of the top portion 362. Moreover, the bottom portion 354 is divided and spaced such that the lower area of the lower surface region 364 of the top portion 362 does not overlap the upper area of the upper surface region 360 of the bottom portion 354.

FIG. 14C depicts the results of a finite element simulation of the mechanical effects experienced by the microstructure device 338 when the microstructure device 338 is heated during manufacturing or operation. During the finite element simulation, an unconstrained length of the movable structure 340 was set to around 125 μm, whereas a constrained length of the movable structure 340 was set to around 30 μm. The results of the finite element simulation show that a tip 368 of the movable structure 340 will droop towards the substrate 342 by around 0.8 μm when heated to a steady state temperature of 400° C.

FIG. 15A depicts a microstructure device 370 that is configured as bridge type device that is in accordance with the present disclosure. The microstructure device 370 includes a movable structure 372 that is suspended above a substrate 374 by means of a first anchor 376 and a second anchor 378. The movable structure 372 may be a conductive beam as typically used in a MEMS switch. The first anchor 376 and the second anchor 378 may be formed of a dielectric material such as silicon nitride, silicon oxide, or silicon oxynitride.

FIG. 15B depicts an exploded view of the microstructure device 370. The movable structure 372 has an upper surface 380, a lower surface 382, a proximal portion 384, and a distal portion 386. The first anchor 376 includes a bottom portion 388 having a bottom area of a bottom surface region 390 attached to the substrate 374 at a substrate surface area outlined by a dashed box 392. An upper area of an upper surface region 394 of the bottom portion 388 is attached to the lower surface 382 of the proximal portion 384 of the movable structure 372. A top portion 396 has a lower area of a lower surface region 398 attached to the upper surface 380 of the proximal portion 384 of the movable structure 372. A dashed line 400 represents a boundary between the proximal portion 384 of the movable structure 372 that is constrained by the first anchor 376, and a free portion of the movable structure 372. The second anchor 378 has a structure similar to the first anchor 376. For example, the second anchor 378 includes a bottom portion 402 having a bottom area of a bottom surface region 404 attached to the substrate 374 at a substrate surface area outlined by a dashed box 406. Note that the first anchor 376 and the second anchor 378 are identical in form to the anchor 88 shown in FIGS. 6A, 6B, and 6C. It should also be understood that any of the anchor configurations described in this disclosure can be used in any number of bridge-type configurations.

FIG. 16A depicts a microstructure device 408 according to the present disclosure. The microstructure device 408 includes a movable structure 410 that is suspended above a substrate 412 by means of an anchor 414. The movable structure 410 may be a conductive beam as typically used in a MEMS switch. The anchor 414 may be formed of a dielectric material such as silicon nitride, silicon oxide, or silicon oxynitride.

FIG. 16B depicts an exploded view of the microstructure device 408. The movable structure 410 has an upper surface 416, a lower surface 418, a proximal portion 420, and a distal portion 422. The anchor 414 includes a bottom portion 424 having a bottom area of a bottom surface region 426 attached to the substrate 412 at a substrate surface area outlined by a dashed box 428. An upper area of an upper surface region 430 of the bottom portion 424 is attached to the lower surface 418 of the proximal portion 420 of the movable structure 410. A top portion 432 has a lower area of a lower surface region 434 attached to the upper surface 416 of the proximal portion 420 of the movable structure 410. A dashed line 436 represents a boundary between the proximal portion 420 of the movable structure 410 that is constrained by the anchor 414, and a free portion of the movable structure 410.

With the microstructure device 408, the upper area of the upper surface region 430 that is attached to the lower surface 418 of the proximal portion 420 of the movable structure 410 is geometrically asymmetric with the lower area of the lower surface region 434 attached to the upper surface 416 of the proximal portion 420. In this particular configuration, the upper area of the upper surface region 430 attached to lower surface 418, and the lower area of the lower surface region 434 attached to the upper surface 416 are equal in area. However, as shown in FIG. 16B, the thickness of the bottom portion 424 is about half of the thickness of the top portion 432.

FIG. 16C depicts the results of a finite element simulation of the mechanical effects experienced by the microstructure device 408 when the microstructure device 408 is heated during manufacturing or operation. During the finite element simulation, an unconstrained length of the movable structure 410 was set to around 125 μm, whereas a constrained length of the movable structure 410 was set to around 30 μm. The results of the finite element simulation show that a tip 438 of the movable structure 410 will droop towards the substrate 412 by around 0.2 μm when heated to a steady state temperature of 400° C.

Turning now to FIG. 17, a semiconductor device 440 that includes a microstructure device in accordance with the present disclosure is disclosed. In this particular instance the microstructure device is in the form of a MEMS switch 442 that may be encapsulated by one or more encapsulating layers 444 and 446, which make up a wafer level package (WLP) around the MEMS switch 442. Moreover, the encapsulating layers 444 and 446 form a substantially hermetically sealed cavity about a conductive beam 448. The cavity is generally filled with an inert gas. Once the encapsulating layers 444 and 446 are in place, and any other semiconductor components are formed on a semiconductor substrate 450, a plastic overmold 451 may be provided over the encapsulating layers 444 and 446 and any other semiconductor components.

With continued reference to FIG. 17, the semiconductor substrate 450 is preferably formed using a semiconductor-on-insulator process, such as a silicon-on-insulator process or a silicon-on-sapphire process. In particular, the semiconductor substrate 450 includes a handle wafer 452 that is formed from silicon, sapphire, glass, or like material to form a foundation layer for the semiconductor device 440. The handle wafer 452 is typically a few hundred microns thick. An insulator layer 454 is formed over the handle wafer 452. The insulator layer 454 is generally formed from an oxide, such as Silicon Dioxide ($SiO_2$), which may range in thickness from 0.1 to 2 microns in the preferred embodiment. A device layer 456, which may include one or more layers, is formed using an appropriate semiconductor material.

The device layer 456 is the layer or layers in which a plurality of active semiconductor devices 458, such as transistors and diodes that employ PN junctions, are formed. The plurality of active semiconductor devices 458 may be formed using a complementary metal oxide semiconductor (CMOS) fabrication process. The device layer 456 is initially formed as a base semiconductor layer that is subsequently doped with N-type and P-type materials to form the active semiconductor devices. Thus, the active semiconductor devices, except for any necessary contacts or connections traces, are generally contained within the device layer 456. Those skilled in the art will recognize various techniques for forming active semiconductor devices in the device layer 456. A metal-dielectric stack 460 is formed over the device layer 456, wherein a plurality of metal and dielectric layers are alternated to facilitate connection with and between the active devices formed in the device layer 456. Further, in the preferred embodiment the handle wafer 452 is made of a high-resistivity semiconductor material where resistance is greater than 500 ohm-cm.

With the present disclosure, the plurality of active semiconductor devices 458 may be formed in the device layer 456 and connected to one another via the metal-dielectric stack 460 directly underneath the MEMS switch 442. Since the device layer 456 resides over the insulator layer 454, high voltage devices, which may exceed ten (10) volts in operation, may be formed directly under the MEMS switch 442 and connected in a way to control operation of the MEMS switch 442 or associated circuitry. Although silicon is described in the preferred embodiment, the semiconductor material for the device layer 456 may include gallium arsenide (GaAs), gallium nitride (GaN), indium phosphide (InP), silicon germanium (SiGe), sapphire, and like semiconductor materials. The device layer 456 typically ranges in thickness from 0.1 microns to 20 or more microns.

As illustrated in FIG. 17, a passivation layer 462 may be provided over the metal-dielectric stack 460. A metal layer used to form a first conductive pad 464, a second conductive pad 466, and an actuator plate 468 may be formed over the passivation layer 462 and etched to form the respective ones of the first conductive pad 464, the second conductive pad 466, and the actuator plate 468. An anchor 470 attached to the semiconductor substrate 450 constrains conductive beam 448 such that conductive beam 448 is suspended above the semiconductor substrate 450. The anchor is fabricated in accordance with the present disclosure. As shown in FIG. 17, the anchor 470 has a structure similar to the structure of the anchor 88, which is depicted in FIGS. 6A, 6B, and 6C.

Prior to packaging, the conductive beam 448 is "released" and is free to actuate or deform. In particular, the conductive beam 448 may be released following formation of a small micro-cavity surrounding the MEMS switch 442. A sacrificial material such as polymethylglutarimide (PMGI) is etched away using wet etches. Following drying and cleaning of the MEMS switch 442, a dielectric is used to hermetically seal the micro-cavity. The deposition temperature for the dielectric is typically 250° C. Later in the manufacturing process, the device can experience multiple exposures to 260° C. solder reflow during attachment of a module incorporating the MEMS switch 442 to an end-user laminate.

Those skilled in the art will recognize improvements and modifications to the preferred embodiments of the present disclosure. All such improvements and modifications are considered within the scope of the concepts disclosed herein and the claims that follow.

What is claimed is:

1. A microstructure device comprising:
   a substrate; and
   a movable structure having an upper surface, a lower surface, a proximal portion, and a distal portion suspended above the substrate by at least one anchor homogenously formed from a dielectric material with a bottom portion having a bottom area of a bottom surface region attached to the substrate and an upper area of an upper surface region attached to the lower surface of the proximal portion of the movable structure, the at least one anchor further including a top portion having a lower area of a lower surface region attached to the upper surface of the proximal portion of the movable structure, wherein the lower surface region of the top portion and the upper surface region of the bottom portion are geometrically asymmetric.

2. The microstructure device of claim 1 wherein the lower surface region of the top portion and the upper surface region of the bottom portion are geometrically asymmetric due to the lower surface region of the top portion extending further towards the distal portion of the movable structure than the upper surface region of the bottom portion.

3. The microstructure device of claim 2 wherein the distal portion of the movable structure is urged away from the substrate by a thermally induced mechanical stress as the substrate, the movable structure, and the at least one anchor are heated.

4. The microstructure device of claim 1 wherein the lower surface region of the top portion and the upper surface region of the bottom portion are geometrically asymmetric due to a measurable difference between a size of the lower area of the lower surface region of the top portion and a size of the upper area of the upper surface region of the bottom portion.

5. The microstructure device of claim 4 wherein the lower surface region of the top portion extends further towards the distal portion of the movable structure than the upper surface region of the bottom portion.

6. The microstructure device of claim 4 wherein the upper surface region of the bottom portion is formed from a plurality of spaced dielectric strips that are oriented longitudinally towards the distal portion of the movable structure.

7. The microstructure device of claim 4 wherein the lower surface region of the top portion extends further towards the distal portion of the movable structure than does the upper surface region of the bottom portion, and wherein the lower surface region of the top portion extends further over the proximal portion of the movable structure than does the upper surface region of the bottom portion.

8. The microstructure device of claim 4 wherein the lower area of the lower surface region of the top portion is larger than the upper area of the upper surface region of the bottom portion, and wherein the bottom portion is divided and spaced such that the lower area of the lower surface region of the top portion does not overlap the upper area of the upper surface region of the bottom portion.

9. The microstructure device of claim 4 wherein the lower area of the lower surface region of the top portion is smaller than the upper area of the upper surface region of the bottom portion, and wherein the bottom portion is divided and spaced such that the lower area of the lower surface region of the top portion does not overlap the upper area of the upper surface region of the bottom portion.

10. The microstructure device of claim 1 wherein the lower surface region of the top portion and the upper surface region of the bottom portion are geometrically asymmetric due to the lower surface region of the top portion being thicker than the upper surface region of the bottom portion.

11. The microstructure device of claim 1 wherein the movable structure is supported by at least two anchors.

12. The microstructure device of claim 1 wherein the lower area of the lower surface region of the top portion is equal to the upper area of the upper surface region of the bottom portion, and wherein the lower surface region of the top portion and the upper surface region of the bottom portion are geometrically asymmetric due to the bottom portion being divided and spaced such that the lower area of the lower surface region of the top portion does not overlap the upper area of the upper surface region of the bottom portion.

13. The microstructure device of claim 1 wherein the lower area of the lower surface region of the top portion is equal to the upper area of the upper surface region of the bottom portion, and wherein the lower surface region of the top portion and the upper surface region of the bottom portion are geometrically asymmetric due to the lower area of the lower surface region extending further towards the distal portion of the movable structure than the upper area of the upper surface region of the bottom portion, and due to the upper area of the upper surface region extending further towards the proximal portion of the movable structure than the lower area of the lower surface region of the top portion.

14. A semiconductor device comprising:
a substrate comprising a handle layer, an insulator layer over the handle layer, and a device layer over the handle layer in which a plurality of active semiconductor devices is formed; and
a microstructure integrally formed on the substrate, the microstructure comprising:
a movable structure having an upper surface, a lower surface, a proximal portion, and a distal portion suspended above the substrate by at least one anchor homogenously formed from a dielectric material with a bottom portion having a bottom area of a bottom surface region attached to the substrate and an upper area of an upper surface region attached to the lower surface of the proximal portion of the movable structure, the at least one anchor further including a top portion having a lower area of a lower surface region attached to the upper surface of the proximal portion of the movable structure, wherein the lower surface region of the top portion and the upper surface region of the bottom portion are geometrically asymmetric.

15. The semiconductor device of claim 14 wherein the lower surface region of the top portion and the upper surface region of the bottom portion comprising the microstructure are geometrically asymmetric due to the lower surface region of the top portion extending further towards the distal portion of the movable structure than the upper surface region of the bottom portion.

16. The semiconductor device of claim 15 wherein the distal portion of the movable structure of the microstructure is urged away from the substrate by a thermally induced mechanical stress as the substrate, the movable structure, and the at least one anchor are heated.

17. The semiconductor device of claim 14 wherein the lower surface region of the top portion and the upper surface region of the bottom portion of the microstructure are geometrically asymmetric due to a measurable difference between a size of the lower area of the lower surface region of the top portion and a size of the upper area of the upper surface region of the bottom portion.

18. The semiconductor device of claim 17 wherein the lower surface region of the top portion extends further towards the distal portion of the movable structure than the upper surface region of the bottom portion.

19. The semiconductor device of claim 17 wherein the upper surface region of the bottom portion is formed from a plurality of spaced dielectric strips that are oriented longitudinally towards the distal portion of the movable structure.

20. The semiconductor device of claim 17 wherein the lower surface region of the top portion extends further towards the distal portion of the movable structure than does the upper surface region of the bottom portion, and wherein the lower surface region of the top portion extends further over the proximal portion of the movable structure than does the upper surface region of the bottom portion.

21. The semiconductor device of claim 17 wherein the lower area of the lower surface region of the top portion is larger than the upper area of the upper surface region of the bottom portion, and wherein the bottom portion is divided and spaced such that the lower area of the lower surface region of the top portion does not overlap the upper area of the upper surface region of the bottom portion.

22. The semiconductor device of claim 17 wherein the lower area of the lower surface region of the top portion is smaller than the upper area of the upper surface region of the bottom portion, and wherein the bottom portion is divided and spaced such that the lower area of the lower surface region of the top portion does not overlap the upper area of the upper surface region of the bottom portion.

23. The semiconductor device of claim 14 wherein the lower surface region of the top portion of the microstructure and the upper surface region of the bottom portion of the microstructure are geometrically asymmetric due to the lower surface region of the top portion being thicker than the upper surface region of the bottom portion.

24. The semiconductor device of claim 14 wherein the movable structure of the microstructure is supported by at least two anchors.

25. The semiconductor device of claim 14 wherein the lower area of the lower surface region of the top portion of the microstructure is equal to the upper area of the upper surface region of the bottom portion of the microstructure, and wherein the lower surface region of the top portion and the upper surface region of the bottom portion are geometrically asymmetric due to the bottom portion being divided and spaced such that the lower area of the lower surface region of the top portion does not overlap the upper area of the upper surface region of the bottom portion.

26. The semiconductor device of claim 14 wherein the lower area of the lower surface region of the top portion of the microstructure is equal to the upper area of the upper surface region of the bottom portion of the microstructure, and wherein the lower surface region of the top portion and the upper surface region of the bottom portion are geometrically asymmetric due to the lower area of the lower surface region extending further towards the distal portion of the movable structure than the upper area of the upper surface region of the bottom portion, and due to the upper area of the upper surface region extending further towards the proximal portion of the movable structure than the lower area of the lower surface region of the top portion.

27. A microstructure device comprising:
a substrate; and
a movable structure having an upper surface, a lower surface, a proximal portion, and a distal portion suspended above the substrate by at least one anchor with a continuous structure formed from a dielectric material with a bottom portion having a bottom area of a bottom surface region attached to the substrate and an upper area of an upper surface region attached to the lower surface of the proximal portion of the movable structure, the at least one anchor further including a top portion having a lower area of a lower surface region attached to the upper surface of the proximal portion of the movable structure, wherein the lower surface region of the top portion and the upper surface region of the bottom portion are geometrically asymmetric.

* * * * *